United States Patent
Schmaelzle et al.

(10) Patent No.: US 8,354,628 B2
(45) Date of Patent: *Jan. 15, 2013

(54) LUMINESCENT SOLAR CONCENTRATOR WITH DISTRIBUTED OUTCOUPLING STRUCTURES AND MICROOPTICAL ELEMENTS

(75) Inventors: Philipp H. Schmaelzle, Los Altos, CA (US); Robert A. Street, Palo Alto, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 159 days.

This patent is subject to a terminal disclaimer.

(21) Appl. No.: 12/853,266

(22) Filed: Aug. 9, 2010

(65) Prior Publication Data

US 2012/0031396 A1    Feb. 9, 2012

(51) Int. Cl.
  *G01C 21/82*    (2006.01)
  *F21V 9/16*    (2006.01)
  *H02N 6/00*    (2006.01)
  *F24J 2/10*    (2006.01)

(52) U.S. Cl. .............. 250/203.4; 250/458.1; 136/247; 126/684

(58) Field of Classification Search .............. 250/203.4, 250/361 R, 363.04, 367, 361 C, 458.1; 136/246, 136/251, 259; 126/576, 605, 684; 356/139.01, 356/139.04
See application file for complete search history.

(56) References Cited

U.S. PATENT DOCUMENTS

| 4,149,902 | A | * | 4/1979 | Mauer et al. .................. 136/247 |
| 4,153,813 | A |  | 5/1979 | Blieden et al. |
| 4,190,465 | A |  | 2/1980 | Boling |
| 4,193,819 | A |  | 3/1980 | Wohlmut |
| 4,935,631 | A | * | 6/1990 | Mosley et al. ............. 250/458.1 |
| 5,274,497 | A | * | 12/1993 | Casey .......................... 359/364 |
| 7,706,030 | B2 |  | 4/2010 | Herloski et al. |
| 2009/0126778 | A1 |  | 5/2009 | Brounne et al. |
| 2009/0205701 | A1 |  | 8/2009 | Govaerts et al. |
| 2009/0235974 | A1 |  | 9/2009 | Mapel et al. |
| 2012/0031467 | A1 | * | 2/2012 | Schmaelzle et al. .......... 136/247 |

OTHER PUBLICATIONS

Currie et al. "High-Efficiency Organic Solar Concentrators for Photovoltaics", Science 321 (2008), pp. 226-228.
Goetzberger et al. "Photovoltaic materials, history, status and outlook", Materials Science and Engineering R 40 (2003), pp. 1-46.
Meyer, Thomas J. J. "Photon Transport in Fluorescent Solar Collectors", Thesis for the degree of Doctor of Philosophy, School of Engineering Sciences, University of Southampton, Jul. 2009, 197 pgs.
Smestad et al. "The thermodynamic limits of light concentrators", Solar Energy Materials 21 (1990), pp. 99-111.
Weber et al. "Luminescent greenhouse collector for solar radiation", Applied Optics, vol. 15, No. 10, Oct. 1976, pp. 2299-2300.

* cited by examiner

*Primary Examiner* — Georgia Y Epps
*Assistant Examiner* — Don Williams
(74) *Attorney, Agent, or Firm* — Bever, Hoffman & Harms, LLP; Patrick T. Bever

(57) ABSTRACT

A luminescent solar concentrator including a light-guiding slab containing a luminescent material that generates light emissions in response to received sunlight, spaced-apart outcoupling structures that provide a distributed outcoupling of the light emissions through predetermined locations on one of the "broadside" (e.g., upper or lower) surfaces of the light-guiding slab, and optical elements positioned to redirect the outcoupled light emissions such that the light emissions are concentrated onto a predetermined target (e.g., a PV cell). Each optical element includes a collimating surface portion and optional returner surface.

20 Claims, 11 Drawing Sheets

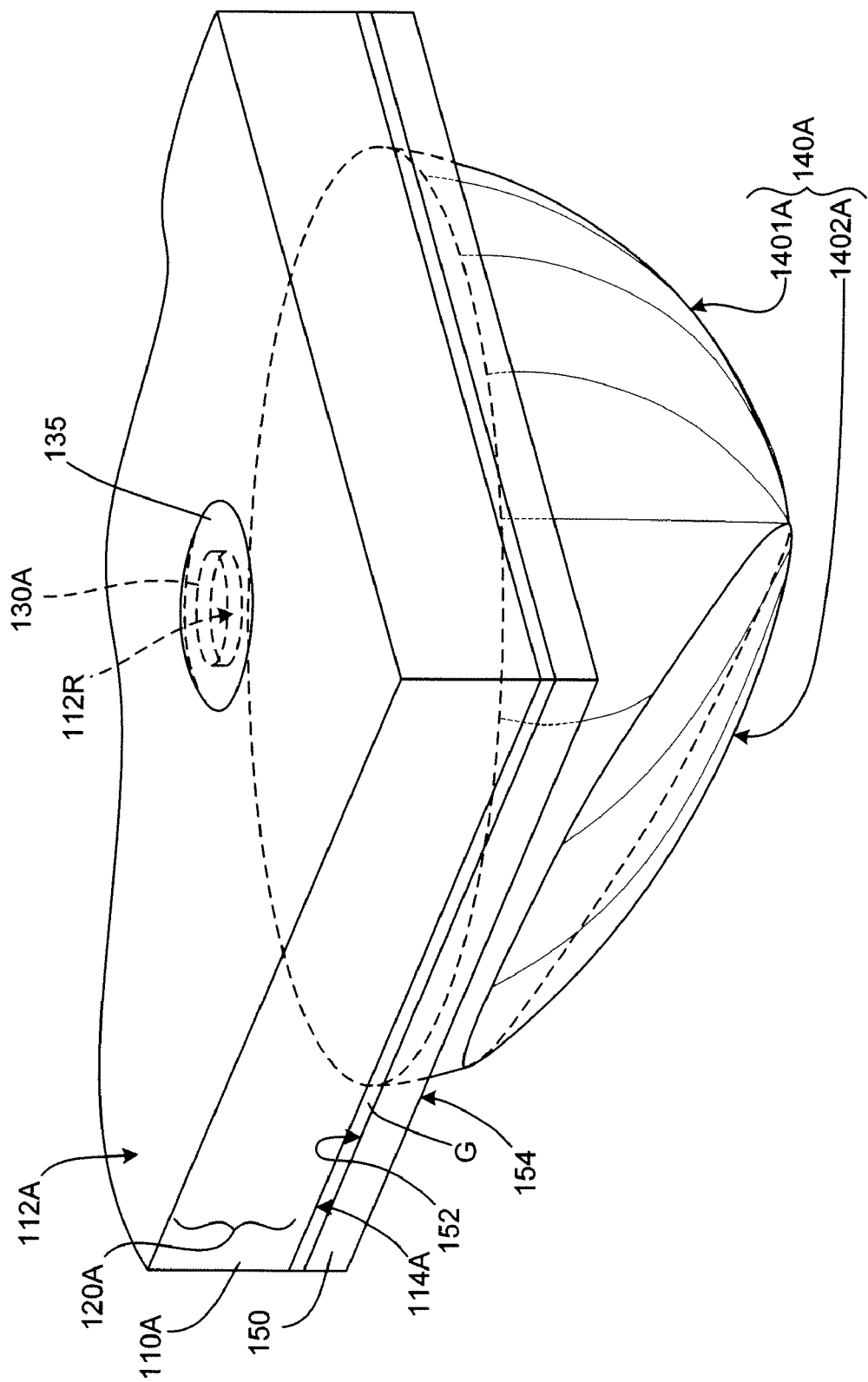

LUMINESCENT SOLAR CONCENTRATOR WITH DISTRIBUTED OUTCOUPLING STRUCTURES AND MICROOPTICAL ELEMENTS

FIELD OF THE INVENTION

The present invention is directed to solar concentrators, and more particularly to luminescent solar concentrators that utilize a luminescent material (e.g., a fluorescent dye), such that emitted photons exhibit a lower photon energy than their corresponding incident photons.

BACKGROUND OF THE INVENTION

Photovoltaic (PV) cells are used to convert solar energy (sunlight) into electricity, and are typically implemented either in flat-panel arrangement, or in conjunction with concentrating solar collectors.
Solar Energy Harvesting requires inexpensive Large Area Components Solar energy arrives at the surface of the earth as a relatively dilute form of radiant energy, peaking at approximately 1000 W/m². Any solar energy harvesting system is therefore required to cover a relatively large area in order to intercept enough sunlight for a meaningful power output. The intercepting area can consist of the energy converting components themselves (e.g., photovoltaic cells in a flat panel module) or consist of optical elements used to direct the intercepted light to a typically smaller converting component (e.g., a higher performance photovoltaic cell in a solar concentrator system). Due to the low price of electricity to which industrialized nations have become accustomed, the key techno-economic challenge and driver is to make the solar energy harvesting system very inexpensive per unit area.

Fabrication processes for photovoltaic cells (PV cells) have benefited from the mature status and sustained progress in semiconductor manufacturing techniques developed for the field of microelectronics. Although it can be expected that process improvements will continue to lower the cost of PV cells into the future, the often cited analogy with Moore's law in microelectronics is only partially appropriate: Moore's law rests heavily on a reduction in surface area per useful unit (e.g. a transistor), while the useful unit in a PV cell is surface area itself. The usefulness of the surface area can be modified in a first example by improving the efficiency of the PV cell, which—being an efficiency metric—naturally has fundamental limits forcing the progress trajectory into an S-curve, and is not the objective of this invention. The usefulness of the surface area can be modified in a second example by optical concentration. It is the objective of this invention to achieve moderate concentration levels (e.g., 10× to 40×, or sometimes higher) with system components that can scale to very low cost and do not incur the system disadvantages typically associated with conventional solar concentrators.
Benefits of Solar Concentration Historically, a single one of the beneficial aspects of low/medium concentration PV systems dominated the discussion: this dominant aspect was the paradigm of "saving silicon", which cannot be the only motivation anymore in times of low cost silicon feedstocks now available for PV cell production. Whether flat panel PV cells or PV cells working in somewhat concentrated light environments will form the mainstay of our futures solar energy systems is still heavily debated today. Extrapolations are subject high uncertainty due to the industrial network effects unfolding over time. While flat panel approaches may well win the race to grid parity, there are some important arguments to note in favor of concentrated approaches. These benefits are given here with a bias towards low/medium concentrators and receivers of similar complexity to crystalline silicon PV cells:

(1) A solar harvesting device having only a portion of the surface area consisting of fragile, electrically connected PV cells allows more degrees of freedom in the system design. These can be used to make the system more robust, flexible, easier to ship, partially translucent, building integrated, just to name a few possibly directions. An economic degree of freedom is won by the fact, that a low/medium concentrator can make good use of higher efficiency cells (e.g. high efficiency silicon or similar), that might be temporarily or systematically not quite competitive for flat panel application under 1× sun.

(2) A large fraction of the capital expenditure of PV module manufacturing goes towards the fabrication machinery for PV cell manufacturing. Producing more total PV module area per year normally requires the installation of proportionally more machinery. This can limit the growth of such a technology and business domain, as the capital for expansion often is the limiting resource. Organic growth from reinvesting profits may be too slow for staying on top of competitors in the market or climate goals in the world. A concentration system can mitigate such capital imposed limits and allow faster scale-up in terms of GWp/year, since the electrical productivity of each cell leaving the (capacity limited) production line is increased by the flux concentration factor $F=Cg^*\eta$ (where $\eta$ is the optical efficiency of the concentrator). Of course, this strategy only holds if the capital cost to obtain fabrication capacity for the optical concentrator is lower on a per Watt basis than the PV cell fabrication facility (fab). This is particularly true for optical concentration elements that can be manufactured on existing machinery. As explained below, systems described in this invention can in large parts be manufactured on film or foil manufacturing equipment, most readily on the microoptical film fabrication equipment that exists today for display backlighting films. These plants have an annual capacity in the hundreds of square kilometers per year. The ability to rapidly scale up production will become a particularly prominent competitive differentiator, as soon as solar energy first undercuts the costs of established fossil fuel based generation.

(3) Concentrator photovoltaics can drastically reduce the embodied energy in the solar energy harvesting system per peak Watt installed when compared to flat panel PV cells. This shortens the energy payback time of the system and similarly the "energy returned on energy invested".

(4) Returning to the initial point made above, a low/medium solar concentrator with good manufacturability can reduce the cost per installed W compared to flat panel systems, if disadvantages of prior art concentrators (such as tracking requirements) are avoided.
Passive Optical Concentrators in the Prior Art Prior art solar concentrators utilize optics (e.g., reflectors, lenses, etc.) to focus sunlight onto a relatively small PV cell. This can be motivated by direct cost savings (e.g., when the area specific cost of the optics is lower than the cost of the PV cell), and/or by the desire for higher system efficiencies (e.g., by allowing to use high performance PV cells that are only available and economic in small areas).

Prior art approaches have so far been mostly passive optical systems, which are defined here as systems that do not substantially change the wavelength of the light they process. In passive optical systems, concentration in the spatial domain comes at the expense of an expansion in the angular domain. This is mandated by principles of conservation of phase space (i.e., Etendue).

The concentration sought from a solar concentrator is a concentration in the spatial domain: The energy intercepted at a large area aperture is coupled to a small area receiver (photovoltaic or thermal) having a surface area that is smaller by a factor Cg. This causes the solid angular subtended by the incoming radiation to expand by approximately the same factor (modified by the refractive index contrast and projection direction) before it reaches the smaller receiver. However, the solid angle from which a receiver can accept light is typically limited to $2\pi^2$ (hemispherical space) or in some cases to the absolute limit of the full sphere at $4\pi^2$. This limits the solid angle from which a concentrator can efficiently accept incoming radiation at its input. However, even direct sunlight originates over the course of year from within a significant portion of the sky hemisphere. The acceptance solid angle starts to become restricted to a solid angle zone narrower than this even for very low spatial concentration factors Cg, e.g. 3×. This can be improved upon by optimizing for the particular angular intensity distribution, but passive static systems beyond 10× concentration are impractical on earth.

It should be noted that the direct sunlight itself subtends only a very small solid angle at any given time. Based on this, prior art systems are able to efficiently reach higher concentration factors by going from static (untracked) systems to tracked concentrators. These tracking systems keep the relative angular position between the sun and the concentrator substantially constant in one or two of the angular dimensions; typically by mechanical movement of the systems. Mechanical tracking systems add installation cost, maintenance cost, reliability concerns, windloading problems and other disadvantages to the system. A system that achieves higher concentration factors than static concentrators without mechanical tracking is therefore highly desirable.

Luminescent Solar Concentrators in the Prior Art

A Luminescent Solar Concentrator (LSC) allows concentration without tracking of both diffuse and direct radiation and have been described in the prior art. LSCs overcome the single wavelength Etendue limits that constrain passive optical concentrators by subjecting each photon to a downward shift in energy (towards longer wavelength), e.g. via a fluorescence process. The photon energy difference is required for compliance with the governing thermodynamic principles and enables concentration factors well beyond the domain to which static concentrators are limited otherwise.

FIG. 13 is a simplified side view illustrating a prior art luminescent concentrator 40, which represents another type of concentrating solar collector (see, e.g., U.S. Pub. App. 2009/0235974, which is incorporated herein by reference in its entirety). Luminescent concentrator 40 includes a light-guiding slab 41 containing a dye layer 46, and one or more PV cells 50 that are secured to light-guiding slab 41. Light-guiding slab 41 is formed using a light transparent material (e.g., glass or plastic) and includes opposing upper and lower planar "broadside" surfaces 42 and 44, and side edges 45 that extend between upper surface 42 and lower surface 44. Dye layer 46 is disposed between upper surface 42 and lower surface 44, and includes one or more luminescent (e.g., fluorescent) materials capable of absorbing sunlight SL (indicated by parallel dashed line arrows in FIG. 13) having a first wavelength, and generating light emissions LE (indicated by dash-dot line arrows in FIG. 13) that have a second, typically longer wavelength. In an alternative embodiment, a separate dye layer is omitted, and the luminescent material is uniformly dispersed throughout slab 41 such that it extends between upper surface 42 and lower surface. PV cells 50 are sized to fit along side edges 45 of light-guiding slab 41. As illustrated by the paths of light emissions LE in FIG. 13, the light transparent material of light-guiding slab 41 is selected such that, during operation, upper surface 42 and lower surface 44 cause a large fraction of the light emissions from the luminescent materials to be retained within light-guiding slab 41 (i.e., light emissions LE are guided between upper surface 42 and lower surface 44 by way of total internal reflection). The fraction of thereby retained light in this step immediately after emission of the fluorophore is often referred to as "trapping efficiency" and is depending on the refractive index contrast between the light guiding slab and its immediate surroundings; with typical values being around 75% (for this step alone) in the case of a slab with refractive index n=1.5 in air, for the case of approximately isotropic emission. The retained light emissions LE travel through light-guiding slab 41 until they encounter typically a side edge 45, at which point the light emissions exit light-guiding slab 41 and are absorbed by PV cells 50, which convert the light emissions into electrical energy. Luminescent concentrator 40 provides an advantage over optical concentrators in that it provides very higher optical concentration factors than otherwise possible without mechanical tracking.

Core Problems of Prior Art LSCs

While LSC hold great promise for future generations of PV systems, two major challenges have blocked their path to success so far. The first is a materials issue (not addressed with this invention, but solved elsewhere). The second problem is an unfavorable scaling behavior of the optical efficiency and/or thickness with area of the collecting and light-guiding slab (addressed with this invention). The former materials related issue concerned the lifetime of suitable luminescent materials. Historically, organic dyes were employed exhibiting insufficient lifetimes under sunlight conditions. Recently however, sunlight stable dyes (such as BASF Lumogen 305 dyes) have become available and are commercially marketed for solar energy applications with good lifetimes in experiments and product specifications. At the same time, quantum dots and newer phosphors have been found and applied to luminescent solar concentrators. Their inorganic composition circumvents the lifetime concerns of dyes altogether.

Transport Losses as the Main Scaling Impediment in Prior Art LSCs

The latter scaling issue arises from the quantitative coupling between lightguide thickness t, chemical concentration of the luminescent material in the slab c, receiver spacing s, and receiver size r. Size r and spacing s are proportional to each other for a fixedly chosen optical concentration factor Cg.

The average pathlength which a photon needs to be transported inside the lightguide slabs scales with spacing s. Transport losses are mainly due to reabsorption in the luminescent material and increase as the transported distance increases with spacing s. This would motivate to reduce spacing (and consequently size r). However, very small PV cells used as receivers (small size r, at least in one dimension) are economically strongly discouraged. They are expensive to make (due to dicing and processing cost), less efficient (due to edge passivation and/or introduced shunt resistances), costly in assembly (due to handling and higher number of required electrical connections) and tend to have yield and reliability issues (due to more situations of possible breakage).

In prior art LSCs, overly small receivers can only be avoided by accepting longer transport distances. To then avoid excessive transport losses, the concentration of luminescent material c (determining the absorbance for both initial sunlight capture and transport reabsorption) must be lowered in an inversely proportional fashion to compensate. However, this in turn necessitates an increased thickness of the lightguide slab, since impinging sunlight would otherwise excessively transmit through the slab uncaptured by the luminescent material. A thicker lightguide slab (being the large area component in the system) would increase system volume, weight and ultimately mass manufactured cost accordingly and is therefore not a fruitful scaling route to cover order of magnitude changes.

It should be noted that the concentration c above is given for a luminescent material which is homogenously dispersed throughout the lightguiding slab. However, the same argument holds to first order with the same scaling behavior for luminescent material placed as one or more layers, or inhomogeneously distributed on or in the lightguiding slab. In such cases, c refers to the average concentration along the thickness direction of the slab. This holds because of the multiplicative interchangeability of thickness and concentration in the exponent of the Lambert Beer law, which is used as a good approximation to the typical transmission decay observed (e.g., by Bode) in LSC materials.

What is needed is a low-cost solar concentrator that provides the advantages of a luminescent concentrator, but avoids the problems associated with existing prior art luminescent concentrators. What is also needed is a solar energy harvesting system utilizing such a low-cost, luminescent concentrator.

SUMMARY OF THE INVENTION

The present invention is directed to a stationary luminescent solar concentrator that disentangles the described coupling and scaling impediments associated with prior art luminescent concentrators by utilizing distributed (i.e., spaced-apart) outcoupling structures that facilitate "escape" of light emissions through predetermined locations on one of the upper or lower "broadside" surfaces of a light-guiding slab, and corresponding optical elements that serve to direct the "escaped" light emissions toward a target solar receptor. Similar to conventional luminescent concentrators, the light-guiding slab includes a luminescent (e.g., fluorescent dye) material disposed between or on the upper or lower "broadside" surfaces of a light transparent material such that sunlight having a first wavelength range that enters the slab and operably interacts with the luminescent material is converted into light emissions having a second (higher) wavelength range, and the light-guiding slab is formed such that a large fraction of the light emissions are retained within the light-guiding slab by TIR between the upper/lower "broadside" surfaces. However, unlike conventional luminescent concentrators, the light emissions retained in the light-guiding slab are "outcoupled" (i.e., caused to escape from) the light-guiding slab at predetermined locations of the upper or lower "broadside" surfaces by way of the outcoupling structures, and the escaped light emissions are then directed by the associated optical elements into a predetermined angular range such that the light emissions are redirected through free space (i.e., air) onto the target solar receptor (e.g., a PV cell or other energy converting structure). These outcoupling structures can be applied (e.g., printed or otherwise) as a finely distributed array of small entities (short s and small r), but do not suffer from the penalties at small sizes that are associated with the prior art because they are simple isolated surface features and not PV cells. That is, by providing the spaced apart outcoupling structures that allow the light emissions to escape the light-guiding slab through predetermined locations on one of the broadside surfaces of the light-guiding slab, the present invention reduces reabsorption of light emissions by reducing the average distance traveled by the light emissions inside the light-guiding slab while still maintaining sufficiently large sizes of the receptor (e.g. a PV cell) to enable economical production of the receptor. By providing optical elements that are positioned to receive the "escaped" light emissions and shaped to direct the light emissions through free space (i.e., air) such that they are overlaid with the emissions originating from other optical elements in the slab on a remotely positioned solar receptor, thereby subjecting it to concentrated light, the present invention effectively decouples the absorption area from the length of the guiding lightpath, thereby avoiding the problems with prior art luminescent concentrators associated with extracting light emissions along the side edge of the light-guiding slab, and thereby providing a highly scalable solar energy harvesting system. By providing a luminescent concentrator including both the outcoupling structures and the optical elements, the present invention facilitates a stationary solar energy harvesting system in which changes in the sun's direction have little or no effect on the optical efficiency of the concentrating system. Of course, since the sunlight intercepting surface is stationary, the amount of intercepted light varies, as the surfaces projected area changes with direction of the incident sunlight. Sunlight is converted from location space (i.e., the sunlight incident on the light-guiding slab) to angular space (i.e., the predetermined directional transmission of light redirected from the concentrator, which is independent of the incident sunlight direction), and then bundles of light from different collimating elements are overlaid in location space (i.e., the concentrated sunlight received by the targeted solar cell/receptor). In addition, the targeted PV cell can be many orders of magnitude larger than the preferably microscopic outcoupling regions, e.g., having a standard manufacturing size or integer fraction of such common size. In effect, the PV cell operates under concentrated light that is independent of the incidence direction of the originally intercepted sunlight and daylight.

Similar to that used in prior art luminescent concentrators, the light-guiding slab is formed using a light transparent material (e.g., glass or plastic, e.g. particularly durable materials of these classes, such as PMMA for plastics), and includes either a luminescent material (e.g., a dye) layer disposed between or on the upper and lower broadside surfaces, or luminescent material uniformly dispersed within the light transparent material. According to an aspect of the invention, the one or more luminescent (e.g., fluorescent) materials disposed in the luminescent material layer are capable of absorbing sunlight that falls within a first wavelength range, and are capable of generating light emissions that fall within a second wavelength range. By utilizing luminescent materials that have a minimal absorption/emission overlap range as is a common practice in the prior art, re-absorption of emitted light by the luminescent materials is minimized because most of the emitted light has a wavelength that cannot be re-absorbed, but reabsorption cannot be entirely avoided as explained by the Franck-Condon principle.

According to an embodiment of the present invention, each outcoupling structure includes a low-absorption, light scattering material that is printed or otherwise positioned to cover a corresponding outcoupling region of the upper or lower broadside surfaces of the light-guiding slab. Because the outcoupling regions are disposed in a predetermined pattern over the upper/lower broadside surface, light emissions travel a relatively small average distance (i.e., in comparison to distances traveled in conventional luminescent concentrators between the emission source and the solar cell) before being outcoupled and passed to a corresponding optical element, thereby minimizing the reabsorption of light emissions characteristic of prior art luminescent concentrators.

In one embodiment of the present invention, the outcoupling structures are disposed in a matrix pattern such that adjacent pairs of outcoupling structures are separated by an average spacing S in the range of 0.05 mm and 5 mm, and each outcoupling structure is formed such that its corresponding outcoupling region formed on the upper or lower broadside surface has an area in the range of $0.001S^2$ and $0.3S^2$. In one specific embodiment, the outcoupling structures are formed on corresponding outcoupling regions on the upper broadside surface and formed such that the light emissions are directed back through the light-guiding slab to the optical elements, where the outcoupling structures are covered with reflective caps that prevent light emissions from being lost into the upper half space. In an alternative embodiment, the outcoupling structures are formed on corresponding outcoupling regions on the lower broadside surface, and direct the light emissions through the outcoupling structures to the optical elements. With either of these arrangements, the total area taken up by the outcoupling regions is up to 30% of the total surface area of the upper or lower broadside surface, and in some possible embodiments as low as 0.1%.

According to an embodiment of the present invention, the multiple optical elements are arranged such that the light emissions redirected (e.g., reflected or refracted) by the multitude of optical elements are overlapped on a solar cell disposed at a predetermined distance away from said solar concentrator such that the photon flux at the solar cell is substantially higher (i.e., concentrated) than the photon flux falling on a similar area without the concentrator. By arranging the optical elements such that the concentration level at the solar cell far exceeds the single wavelength Etendue limit even for diffuse light conditions (which is possible due to the use of a luminescent conversion as a component of the system), the solar concentrators of the present invention facilitate the production of medium-concentration (i.e., >5x) dedicated modules and PV farms.

According to an embodiment of the present invention, the optical elements utilized to direct or collimate the light emissions from the outcoupling structures are formed or otherwise disposed on an optical microstructure substrate (concentrating sheet). In one specific embodiment, the outcoupling structures are disposed on the upper broadside surface, and spacing structures are provided between the lower broadside surface of the light-guiding slab and an upper planar surface of the optical microstructure substrate. In another specific embodiment, the outcoupling structures are disposed in an airgap space provided between the lower broadside surface of the light-guiding slab and an upper planar surface of the optical microstructure substrate. The optical microstructure substrate is also formed from a light transparent material (e.g., glass or plastic) and at least one of its surfaces is processed (e.g. preferably embossed, film cast, molded, UV molded; if desired also lithographically structured, etched, ablated, additively manufactured, printed) to include spaced-apart, roughly dome-shaped protuberances, where each protuberance is disposed below a corresponding outcoupling structure such that light emissions passed through each outcoupling structure are directed into the corresponding protuberance. In one embodiment, a reflective material layer (e.g., aluminum) is formed on the lower surface of the optical microstructure substrate such that a concave reflective surface reflects the light emissions through the light-guiding slab and onto a target structure (e.g., a PV cell). By forming the dome-shaped protuberances such that the reflected light emissions from the concave reflective surface are directed onto the target solar cell, the present invention allows for a target solar cell having a typically larger and standardized shape than those causing the production and performance related issues associated with conventional luminescent concentrators.

In accordance with a specific embodiment, each protuberance of the optical microstructure substrate is shaped such that each of the optical elements includes a collimating reflector surface portion, where each collimating reflector surface portion is shaped to redirect light emissions passed by said associated outcoupler. By providing such collimating reflector surface portions on each of the optical elements, the present invention facilitates reliable concentration of the light emissions in a way that can be overlapped onto a target PV cell.

According to another specific embodiment of the present invention, each of the optical elements also includes a returner surface portion that is shaped to reflect (recycle) light emissions passed by an associated outcoupling structure back to the associated outcoupling structure, and each returner surface portion is positioned to receive light emissions passed by the associated outcoupling structure at angles that would make their redirection in the collimated direction difficult with a simple optical element. That is, due to limitations posed by using a single optical element to redirect all of the light passed through its associated outcoupling structure, not all of the light emissions passing through the outcoupling structures can be directed into the desired collimated direction. By positioning the returner surface portion to receive these "unusable" light emissions, at least some of the "unusable" light emissions can be reflected back to the outcoupling structure for recycling and eventual redirection to the target PV cell. The present inventors have determined that providing such returner surface portions on each of the optical elements substantially increases the amount of redirected light emissions redirected to the target PV cell, thereby significantly increasing power generation when comparing to a system according to this invention, having the same manufacturing complexity but no light recycling means. According to a specific embodiment, the collimating reflector surface portions and the returner surface portion are generated as portions of spherical surfaces, where a radius of the collimating reflector surface portions is approximately two times a radius of the returner surface portion.

According to another alternative embodiment of the present invention, a light transparent top cover is disposed over the light-guiding slab with an air gap provided between a lower surface of the top cover and the upper broadside surface of the light-guiding slab, thereby protecting the light-guiding slab from accumulated dust and wear that might affect the total internal reflection.

According to another alternative embodiment of the present invention, each of the optical elements is formed using a shape similar to a compound parabolic concentrator (CPC), which may have been sheared or tilted to achieve the desired direction in which light is directed including a light-transmissive material (e.g., glass or plastic) of a predetermined refractive index and having an entry surface coupled by way of an associated outcoupling structure to the light-guiding slab, an exit surface disposed at an end of the CPC opposite to the entry surface, and one or more parabolic surfaces that extend between the entry surface and the exit surface. The CPC-like shapes may be provided as a microoptical sheet, having the "small" ends facing away from the substrate. With this arrangement, light emissions escaping the light-guiding slab through a corresponding outcoupling structure (which in this embodiment may be joined like any of the variants described elsewhere in this text, but might be very beneficially a transparent region in contact with the otherwise low-index surrounded light guiding slab) are directed by TIR from the one or more parabolic surfaces along a predetermined light path toward a target PV cell, and therefore provides a possible advantage over other described embodiments in that the light emissions are not reflected back through the light-guiding slab to the target PV cell. It should be noted that this embodiment does not rely on metallization or any other opaque layers covering the entire area. Besides reducing manufacturing cost, this allows light from most angles to transmit through the microoptical sheet, e.g. to reach the luminescent slab.

According to alternative disclosed specific embodiments of the present invention, a stationary photovoltaic (PV) system (e.g., an untracked PV farm) is made up of one or more modules, each module including one or more PV cells and one or more of the solar concentrators according to any of the embodiments described above. In one embodiment, a stationary PV system module includes one solar cell and a corresponding solar concentrator, wherein the solar concentrator comprises a panel that is fixedly disposed a predetermined angle relative to ground in order to efficiently capture sunlight, and the PV cell is mounted a predetermined distance away from the solar concentrator and positioned to receive the concentrated light emissions generated by the solar concentrator. In another embodiment, each system module includes two or more solar cells, each having different operating spectrums (e.g., short, medium and long, respectively), and the corresponding solar concentrator includes multiple luminescent material layers that generate light emissions having different (i.e., short, medium and long) spectrums in order to provide a more efficient transfer of sunlight energy to usable solar power by recycling the concept of spectral splitting in conjunction with this invention. The solar concentrator is also arranged such that the outcoupling structures and associated optical elements are positioned to direct light emissions of each of the different spectrums to an associated solar cell. In one specific embodiment, three different solar concentrators, each with a different luminescent material layer, are arranged in a stack and optimized to direct light emissions of the different spectrums to one of the associated solar cells, each solar cell being bandgap matched to the particular spectrum it receives. In another specific embodiment, each system module includes a solar concentrator according to any of the embodiments described above that lays flat on the ground, and a solar cell is held by arms above the solar concentrator.

BRIEF DESCRIPTION OF THE DRAWINGS

These and other features, aspects and advantages of the present invention will become better understood with regard to the following description, appended claims, and accompanying drawings, where:

FIGS. 4(A) and 4(B) are top perspective and cross-sectional side views, respectively, showing a portion of a solar concentrator in accordance with a specific embodiment of the present invention;

DETAILED DESCRIPTION OF THE DRAWINGS

The present invention relates to a modified luminescent solar concentrator in which spaced-apart outcoupling structures provide a distributed outcoupling of light emitted by a luminescent (e.g., fluorescent dye) material. The following description is presented to enable one of ordinary skill in the art to make and use the invention as provided in the context of a particular application and its requirements. As used herein, directional terms such as "upper", "upwards", "lower", "downward", "front", "rear", are intended to provide relative positions for purposes of description, and are not intended to designate an absolute frame of reference. In addition, the phrases "integrally connected" and "integrally molded" is used herein to describe the connective relationship between two portions of a single molded or machined structure, and are distinguished from the terms "connected" or "coupled" (without the modifier "integrally"), which indicates two separate structures that are joined by way of, for example, adhesive, fastener, clip, or movable joint. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
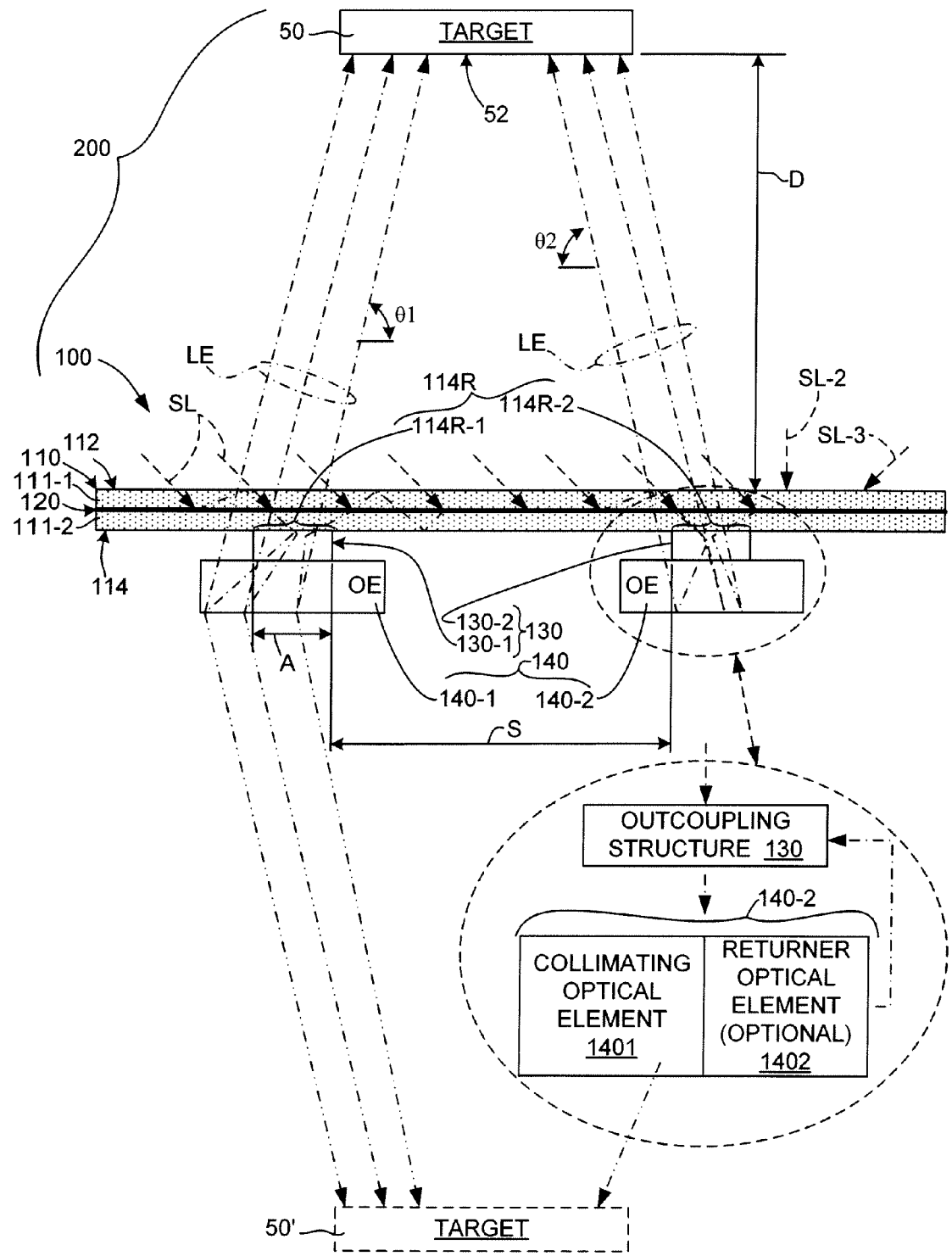
FIG. 1 is a simplified side view showing a PV system including a solar concentrator in accordance with an embodiment of the present invention.

FIG. 1 is a simplified partial side view showing a stationary photovoltaic (PV) system 200 including a luminescent solar concentrator 100 and a target PV cell (solar receptor) 50 according to an embodiment of the present invention. As indicated in FIG. 1, solar concentrator 100 serves to receive sunlight beams SL from any direction of incidence (dashed-line arrows), and to generate light emissions LE (dashed-dotline arrows) that are concentrated (directed) onto an active surface 52 of a PV cell 50, which is fixedly maintained at a distance D away from solar concentrator 100, either above or below the slab 112.

Figure 2:
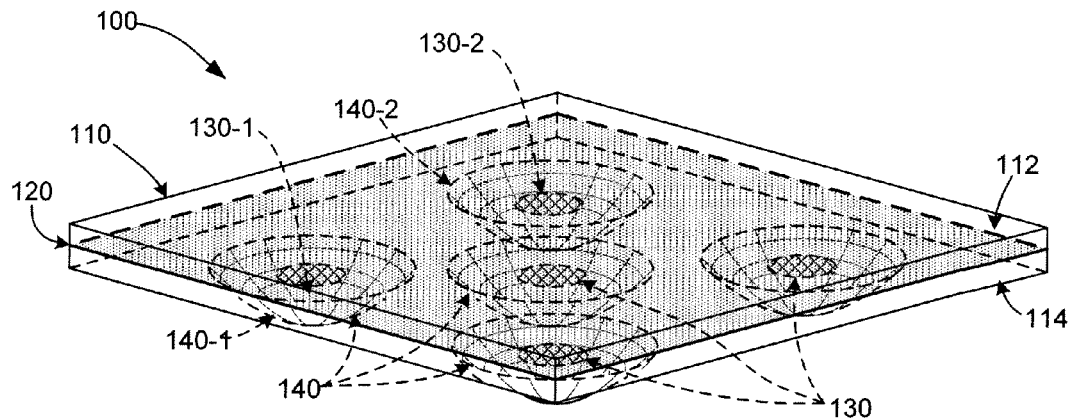
FIG. 2 is a top perspective view showing the solar concentrator of FIG. 1.

Referring to the central portion of FIG. 1 and to FIG. 2 (which shows a portion of solar concentrator 100 in perspective view), solar concentrator 100 generally includes a light-guiding slab (substrate) 110, distributed spaced-apart outcoupling structures 130 and associated optical elements 140 that are disposed in a predetermined pattern, wherein outcoupling structures 130 and optical elements 140 are secured to light-guiding slab 110 in a predetermined fixed relationship that is discussed below.

In the present embodiment, light-guiding slab 110 includes upper and lower substrates 111-1 and 111-2 formed of a light transparent material (e.g., glass or plastic), and includes a luminescent material layer 120 disposed between upper and lower substrates 111-1 and 111-2. Upper substrate 111-1 defines an upper broadside surface 112 that, during operation, is disposed to face the sun such that sunlight beams SL pass through upper broadside surface 112 into light-guiding slab 110. Lower substrate 111-2 defines a lower broadside surface 114 that faces a direction opposite to that of upper surface 111. Those skilled in the art will recognize that upper and lower substrates 111-1 and 111-2 are delineated for purposes of illustrating a separate luminescent material layer 120, and that in most embodiments, upper and lower substrates 111-1 and 111-2 comprise upper and lower regions of an integral (single piece) slab 110. The selected light transparent material of the light-guiding slab 110 preferably has an index of refraction that is at least higher than its immediate surroundings (e.g., with a gas, such as air, or another low index material), preferably at least 1.3, such that upper surface 112 and lower surface 114 cause most of light emissions LE generated by the luminescent materials of layer 120 to be retained within (i.e., guided by) the light-guiding slab 110 by way of total internal reflection between upper surface 112 and lower surface 114.

Figure 3:
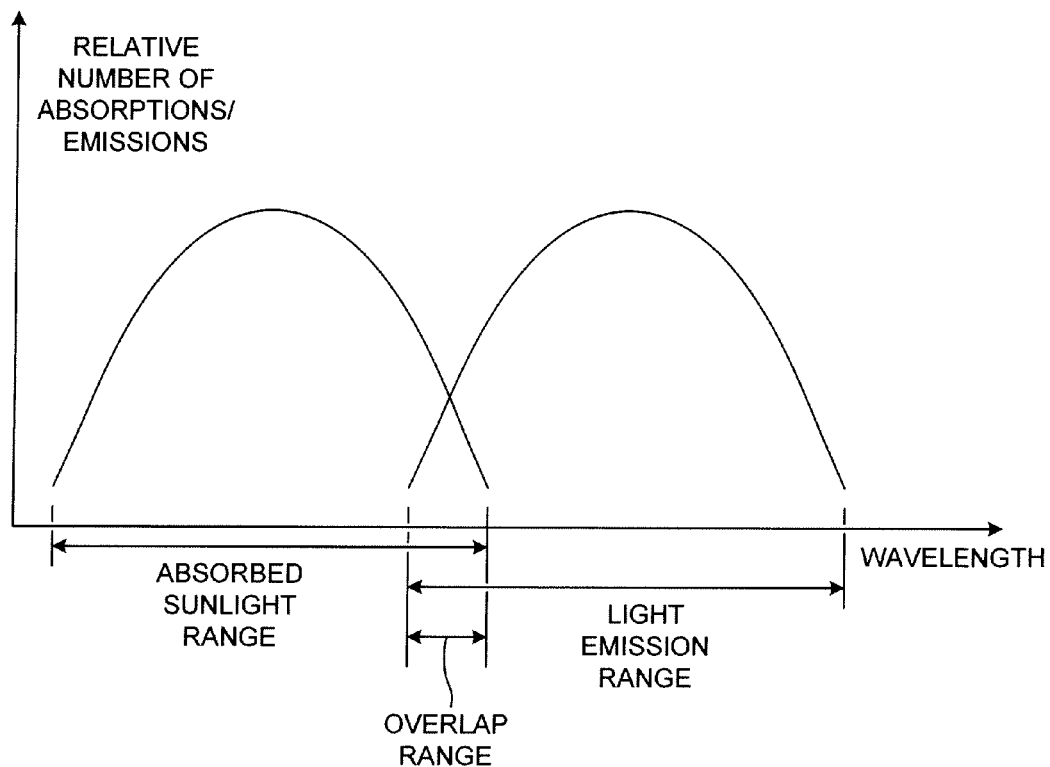
FIG. 3 is a graph showing preferred operating characteristics of the luminescent material disposed in the solar concentrator of FIG. 1.

FIG. 3 is a graphic representation indicating the preferred operating characteristics of the luminescent (e.g., fluorescent) material disposed in luminescent material layer 120. In general, luminescent material layer 120 includes one or more luminescent materials similar to those used in prior art luminescent concentrators that are capable of absorbing sunlight SL falling within a first (relatively short) wavelength range, and generating light emissions LE having wavelengths that fall within a second (relatively long) wavelength range. In particular, the bell-shaped curve on the left side of FIG. 3 indicates a typical absorption characteristic of the luminescent material, where the selected luminescent material is capable of absorbing sunlight beams SL falling within the indicated absorbed sunlight wavelength range. A broader absorption spectrum is desirable and in some cases usable by employing quantum dots as the luminescent species, which are commercially available and known to those skilled in the art. In contrast, the bell-shaped curve on the right side of FIG. 3 indicates a preferred emitted light characteristic of the luminescent material, where the selected luminescent material is capable of generating light emissions that fall within the indicated light emission wavelength range. According to the preferred operating characteristics of the luminescent material disposed in layer 120, the overlap range (indicated in the lower center of FIG. 3) is selected to have an integral under the intersected absorption/emission spectral curves, that is less than 20%, preferably less than 10% of the integral under the emission spectrum alone. Such materials are known to those skilled in the art and it is not the objective of this invention to describe new materials, but instead employ existing or future materials in the optical system approach taught in this specification. The benefit of utilizing luminescent materials having this characteristic is that re-absorption of emitted light by the luminescent materials is minimized if most or all of the emitted light has a wavelength that cannot be re-absorbed. Suitable luminescent materials utilized in layer 120 include one of luminescent dyes (typically organic), phosphors (typically inorganic) or quantum dots. Alternatively, mixtures of these materials may be used, preferably dye mixtures of suitable concentrations that enable efficient excitation transfer between different dye species (such mixtures are known to those skilled in the art). Exemplary luminescent materials include Diaresin dyes from Mitsubishi Chemical (Japan), Lumogen dyes from BASF (Germany), Irgalite and Maxilon dyes from Ciba Specialty Chemicals (Germany), Macrolex dyes from Lanxess (Germany), and Hostasol dyes from Clariant. Product examples include Lumogen F Red 305 (BASF/Ciba) and Rhodamin 6G (the latter has been historically used in research although not sunlight stable). Those skilled in the art will recognize that the specific materials and products listed above are exemplary, and are not intended to be limiting.

According to an aspect of the invention, outcoupling structures 130 comprise a low-absorption, light scattering material that is printed, lithographically defined, etched, achieved by topographical modification or otherwise disposed on a corresponding outcoupling region of upper broadside surface 112 or lower broadside surface 114, and facilitate the "escape" of retained light emissions from light-guiding slab 110 through the outcoupling regions. Outcoupling structure may be designed to emit in either of the two hemispheres, into which the broadside surfaces 112 (or 114) divide the full solid angle. Dominantly reflective behavior can be achieved, e.g., by an opaque scatterer, whereas a preferably transmissive structure can be achieved by applying a surface topography, either in subtractive or additive fashion. In the embodiment shown in FIGS. 1 and 2, outcoupling structures 130-1 and 130-2 are respectively disposed on outcoupler regions 114R-1 and 114R-2 of lower surface 114. As discussed below with reference to alternative embodiments, outcoupling structures 130 may also be disposed on upper surface 112. Outcoupling structures 130 facilitate the "escape" of retained light emissions from light-guiding slab 110 either by reducing the index of refraction or otherwise causing light emissions LE to not undergo total internal reflection where light emissions encounter an outcoupling structure 130. This may be associated in some cases with a change in direction of the escaping light ray, which may be a tolerated artifact or a carefully designed feature using techniques for designing scatter profiles well known to those skilled in this art. That is, as in conventional luminescent concentrators, a large portion of light emissions LE are emitted by layer 120 at an angle that produces TIR between upper broadside surface 112 and lower broadside surface 114 so long as the light emissions are reflected from the "normal" areas of upper broadside surface 112 and lower broadside surface 114 (i.e., the areas not contacted by a corresponding outcoupling structure 130). However, when these light emissions encounter an outcoupling region 114R, the light emissions are "outcoupled" (i.e., passed) out of light-guiding slab 110 either through that outcoupling region 114R and into outcoupling structures 130, or scattered at the interface between light-guiding slab and outcoupling structures 130. Outcoupling structures 130 comprise a structure that is scattering (e.g., white paint), random refractive (e.g., a nonscattering diffuser such as those designed by Luminit, Calif.), diffractive (e.g., a grating), gradient index (e.g., a coating with variable index), translucent scattering (e.g., volume scattering), transparent (e.g., a deposited volume of clear plastic resin), or plasmonic (e.g., sub-micrometer silver particles) such that, upon entering or encountering outcoupling structures 130, the light emissions pass through or are redirected by outcoupling structures 130 in a predetermined general direction (e.g., downward in FIG. 1). As indicated in FIG. 1, at least some of the light emissions LE that pass along light-guiding slab 110 and encounter one of outcoupling structures 130-1 and 130-2 are redirected downward toward optical elements 140-1 and 140-2, respectively. By providing the spaced apart outcoupling structures 130 that allow the light emissions to escape light-guiding slab 110 through predetermined locations on one of upper broadside surface 112 and lower broadside surface 114, the present invention reduces reabsorption of the light emissions by reducing the average distance traveled by the light emissions inside light-guiding slab 110. That is, the parameters are selected such that an average light emission LE will travel a shorter average distance within light-guiding slab 110 before escaping by means of an outcoupling structure 130 than it would travel in a conventional luminescent concentrator before reaching a side edge, thereby reducing the chances of the light emission LE from encountering a luminescent material molecule, with the associated likelihood of reabsorption loss.

In one embodiment the outcoupling structure 130 are disposed in the matrix pattern such that adjacent pairs of outcoupling structure 130 are separated by an average spacing S in the range of 0.05 mm and 5 mm, and each outcoupling structure 130 is formed such that its corresponding outcoupling region 114R formed on lower broadside surface 114 has an area A in the range of $0.001S^2$ and $0.3S^2$. Preferably, the total area taken up by outcoupling regions 114R is 30% or less of the total surface area of lower broadside surface 114, and in some possible embodiments as low as 0.1% of the total area. The specific spacing S and area A of outcoupling structures 130 is selected within these parameters for a given practical application according to the performance characteristics of the selected materials and required operating characteristics.

Referring to the lower portion of FIG. 1 and FIG. 2, according to the present embodiment, optical elements 140 are fixedly secured to light-guiding slab 110, and each of the optical elements 140 is arranged relative to an associated outcoupling structure 130 such that at least some of the light emissions passed through each associated outcoupling region 114B is directed into an associated optical element 140. For example, as indicated by the dashed-dot-lined arrows in FIG. 1, optical element 140-1 is arranged below outcoupling structure 130-1 such that light emissions LE passed through outcoupling region 114R-1 is directed into optical element 140-1, and optical element 140-2 is arranged below outcoupling structure 130-2 such that light emissions LE passed through outcoupling region 114R-2 are directed into optical element 140-2. In accordance with alternative embodiments, each optical element 140 is constructed such that the received light emissions are then redirected (either reflected or refracted) in a predetermined direction toward a target solar receptor. For example, in one specific embodiment indicated by the dash-dot-lined arrows disposed in the upper portion of FIG. 1, optical element 140-1 includes a reflective surface that reflects light emissions LE passed through outcoupling region 114R-1 at a first angle $\theta 1$ toward solar receptor 50, and optical element 140-2 includes a reflective surface that reflects light emissions LE passed through outcoupling region 114R-2 at a second angle $\theta 2$ toward solar receptor 50. In an alternative specific embodiment indicated by the dash-dot-dot-lined arrows in the lower portion of in FIG. 1, optical elements 140-1 and 140-2 include refractive (or light transparent) surfaces that redirect light emissions LE passed through outcoupling regions 114R-1 and 114R-2, respectively, downward toward an alternative solar receptor 50'. In accordance with another specific embodiment, optical elements 140 are arranged such that the redirected light emissions LE are substantially concentrated at a predetermined distance away from solar concentrator 100. For example, optical elements 140-1 and 140-2 are arranged such that the light emissions LE redirected along angles $\theta 1$ and $\theta 2$ are substantially concentrated on solar receptor 50, preferably such that active surface 52 of solar receptor 50 receives a substantially homogenous (uniform) amount of light emission energy. By providing optical elements 140 that are positioned to receive the "escaped" light emissions and shaped to direct the light emissions through free space (i.e., air) such that they are overlaid with the emissions originating from other optical elements in the slab on a remotely positioned solar receptor, thereby subjecting it to concentrated light, the present invention effectively decouples the absorption area from the length of the guiding lightpath, thereby avoiding the problems with prior art luminescent concentrators associated with extracting light emissions along the side edge of the light-guiding slab, and thereby providing a highly scalable solar energy harvesting system. In addition, by arranging the optical elements 140 such that the concentration level at the solar cell far exceeds the single wavelength Etendue limit even for diffuse light conditions (which is possible due to the use of a luminescent conversion as a component of the system), the solar concentrators of the present invention facilitate the production of medium-concentration (i.e., >5×) dedicated modules and PV farms.

According to an aspect of the present invention, luminescent concentrator 100 is distinguished over conventional systems in that luminescent concentrator 100 facilitates converting sunlight energy from location space to angular space, and then back to location space, thereby facilitating a stationary solar energy harvesting system in which changes in the sun's direction have little or no effect on the optical efficiency of the concentrating system. That is, by providing both outcoupling structures 130 and optical elements 140 as set forth above, solar concentrator 100 converts sunlight energy from location space to angular space (i.e., the sunlight incident on light-guiding slab 110) to angular space (i.e., the predetermined directional transmission of light LE redirected from the concentrator along predetermined angles $\theta 1$ and $\theta 2$, which are independent of the incident sunlight direction), and then bundles of light from different collimating elements are overlaid in location space (i.e., the concentrated sunlight received by the targeted solar cell 50). Note that this conversion of location to angular space occurs in precisely the same manner whether the sunlight SL is directed toward the right onto upper broadside surface 112 (as indicated on the left side of FIG. 1), normal to upper broadside surface 112 (as indicated by arrow SL2 on the right side of FIG. 1), or downward and to the left onto upper broadside surface 112 (as indicated by arrow SL2 on the right side of FIG. 1). That is, any of these sunlight directions produce light emissions LE within the light-guiding slab 110 that have substantially the same angular distribution (a large part of which capable to be guided by TIR), and all such light emissions LE passed by outcoupling structures 130-1 and 130-2 are redirected into angular space by optical elements 140-1 and 140-2, which redirect the light emissions along predetermined angles $\theta 1$ and $\theta 2$ to solar receptor 50. The light emissions LE transmitted in angular space by optical elements 140-1 and 140-2 are then reconverted at the location space defined by active surface 52 of solar receptor 50. According to an aspect of the invention, the surface area of the sunlight receiving surface of solar concentrator 100 is larger than the surface area size of active surface 52. Therefore, solar concentrator 100 serves to concentrate the light emissions LE on active surface 52 of solar receptor 50. Thus, by providing luminescent concentrator 100 including both outcoupling structures 130 and the optical elements 140, the present invention facilitates a stationary solar energy harvesting system in which changes in the sun's position have little or no effect on the amount of light transmitted to solar receptor 50, and the size (area) of solar receptor 50 can be made much smaller than that of luminescent concentrator 100.

According to yet another aspect of the present invention, each of the optical elements 140-1 and 140-2 also includes a returner surface portion that reflects (recycles) "ususable" light emissions back to associated outcoupling structures 130-1 and 130-2. For example, indicated in the dashed-line bubble in FIG. 1, optical element 140-2 includes both a collimating optical element 1401 and an optional returner optical element 1402. Due to limitations posed by using a single optical element to redirect all of the light passed through associated outcoupling structure 130-2, not all of the light emissions passing through outcoupling structure 130-2 can be directed into the desired collimated direction by collimating optical element 1401. By positioning returner surface portion 1402 to return these "unusable" light emissions to outcoupling structure 130-2, as indicated functionally by the arrow inside the bubble, at least some of the "unusable" light emissions can be recycled and eventually redirected to target PV cells 50 or 50'. The present inventors have determined that providing returner surface portions 1402 on each optical element 140-1 and 140-2 substantially increases the amount of redirected light emissions redirected to the target PV cell, thereby significantly increasing power generation when comparing to a system according to this invention, having the same manufacturing complexity but no light recycling means.

Figure 4B:
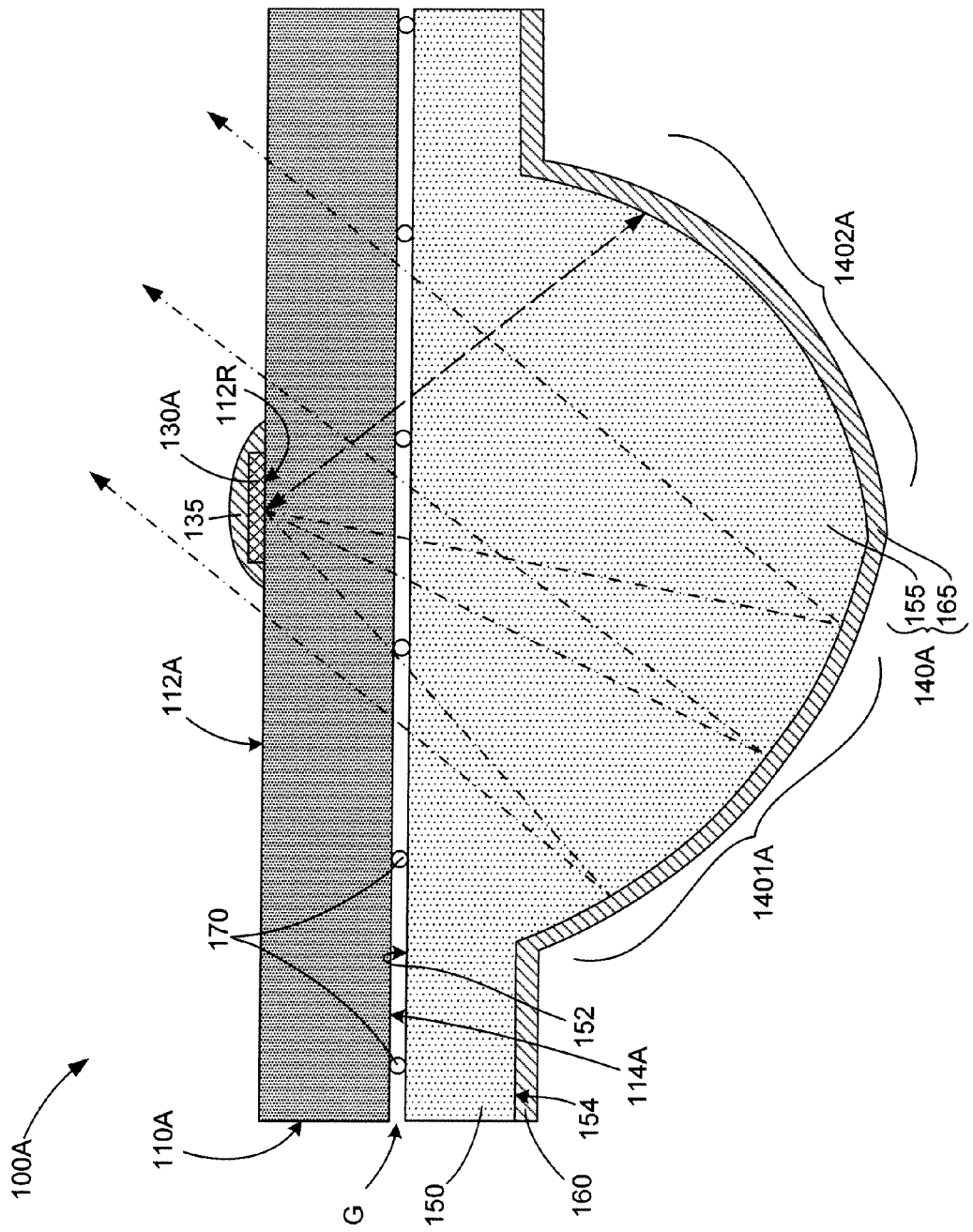

FIGS. 4(A) and 4(B) are top perspective and simplified cross-sectional side views, respectively, showing a portion of a solar concentrator 100A according to a first specific embodiment of the present invention. Similar to the previous embodiment, solar concentrator 100A includes a light-guiding slab 110A, an outcoupling structure 130A, and an optical element 140A. Although the illustrated portion of solar concentrator 100A shows a single outcoupling structure 130A and a single optical element 140A for clarity, it is to be understood that solar concentrator 100A includes multiple outcoupling structures 130A and associated optical elements 140A arranged substantially as described above with reference to FIG. 2, and that the description below directed to outcoupling structure 130A and optical element 140A are intended to exemplify all of these structures.

Referring to the upper portions of FIGS. 4(A) and 4(B), and similar to description of the previous embodiment, light-guiding slab 110A is formed using a light transparent material (e.g., glass or plastic), and includes an upper broadside surface 112A and an opposing lower broadside surface 114A. However, light-guiding slab 110A differs from the previous embodiment in that a luminescent material 120A is uniformly dispersed within the light transparent material between upper surface 112A and lower surface 114A in a manner known to those skilled in the art, instead of being disposed in a defined layer as described above. In an alternative embodiment (not shown), light-guiding slab 110A may be constructed with a defined luminescent material layer similar to that described above.

Solar concentrator 100A also differs from the previously described embodiment in that each outcoupling structure 130A is disposed on a corresponding outcoupling region 112R of upper broadside surface 112A, and a reflective light cap 135 is disposed over outcoupling structure 130A. As indicated in FIG. 4(B), with this arrangement light emissions that pass through outcoupling region 112R are directed back through light-guiding slab 110A to optical element 140A, where reflective caps 135 serve to prevent the light emissions from being lost through the upper side of solar concentrator 100A. The main benefit of positioning outcoupling structures 130A on upper broadside surface 112A (i.e., on the side of light-guiding slab 110A opposite to optical elements 140A) is that this arrangement provides a longer distance between outcoupling structure 130A and corresponding optical element 140A, which facilitates more closely confined direction in angle space of the light emissions to the desired target (not shown).

Solar concentrator 100A further differs from the previously described embodiment in that all optical elements 140A are disposed on (i.e., formed by portions of) a single optical microstructure substrate 150 having a planar upper surface 152 and an opposing lower surface 154. Optical microstructure substrate 150 is molded or otherwise formed using a light transparent material (e.g., plastic or glass), and is fixedly connected to the light-guiding slab 110A such that a small airgap space G is provided between lower broadside surface 114B of light-guiding slab 110B and upper planar surface 152 of optical microstructure substrate 150. Referring to FIG. 4(B), in one specific embodiment spacing structures 170 are provided between lower broadside surface 114B and upper planar surface 152 to reliably maintain airgap space G.

As indicated in FIG. 4(B), lower surface 154 of optical microstructure substrate 150 is processed (e.g., embossed) to include spaced-apart, roughly dome-shaped protuberances 155, and a reflective material layer 160 (e.g., aluminum) is formed on lower surface 154 of optical microstructure substrate 150 such that concave reflective surface portions 165 of reflective material layer 160 are disposed on each dome-shaped protuberances 155. According to the present embodiment, each optical element 140A is formed by an associated protuberance 155 of optical microstructure substrate 150 and a corresponding concave reflective surface portion 165 of reflective material layer 160. By providing each optical element 140A on a single optical microstructure substrate 150 in this way, manufacturing is greatly simplified because all of the optical elements 140A are secured to light-guiding slab 110A in a single mounting/laminating operation. In addition, because the optical elements 140A are maintained in a known fixed relationship by optical microstructure substrate 150, the placement and alignment of each outcoupling structure 130A with its corresponding is optical element 140A is greatly simplified, whereby light emissions passed through outcoupling structure 130 are directed into protuberance 155. Specifically, as indicated by the arrows in FIG. 4(B), light emissions passed through outcoupling structure 130A into protuberance 155 are reflected by concave reflective surface 165 in the manner described below such that at least some of the light emissions are directed through light-guiding slab 110A and onto a target structure (e.g., a PV cell, not shown). By carefully forming dome-shaped protuberances 155 and then depositing reflective material layer 160 using known techniques (e.g., electroplating, sputtering, evaporative metal coating), highly precise concave reflective surface 165 are essentially self-forming, thereby minimizing manufacturing costs and facilitating target solar cells having a standardized shape, thereby avoiding the production and performance related issues associated with conventional luminescent concentrators.

Referring again to the bottom of FIG. 4(A), according to another aspect of the present embodiment, each optical element 140A of solar concentrator 100A includes both a collimating surface portion 1401A and a returner surface portion 1402A. That is, each protuberance of optical microstructure substrate 150 is shaped with one or more surfaces such that each optical element 140A a first portion formed as collimating reflector surface portion 1401A, and a second portion formed as returner surface portion 1402A.

Referring to FIG. 4(B), as indicated by the dash-dot-lined arrows, each collimating surface portion 1401A is shaped such that light emissions passed by outcoupling structure 130A onto any point of collimating surface portion 1401A are reflected by the corresponding portion of concave reflective surface 165 in a substantially parallel direction toward the target solar receptor (not shown). By providing collimating reflector surface portion 1401A, and by forming optical microstructure substrate 150 such that the reflected light emissions from all of the collimating reflector surface portions 1401A are overlapped on the target solar receptor, the present invention facilitates reliable concentration of the light emissions in a way that can be homogenously overlapped onto a target PV cell (not shown), thereby maximizing power generation by supplying substantially the same amount of radiated energy to all areas of the target PV cell.

Figure 5:
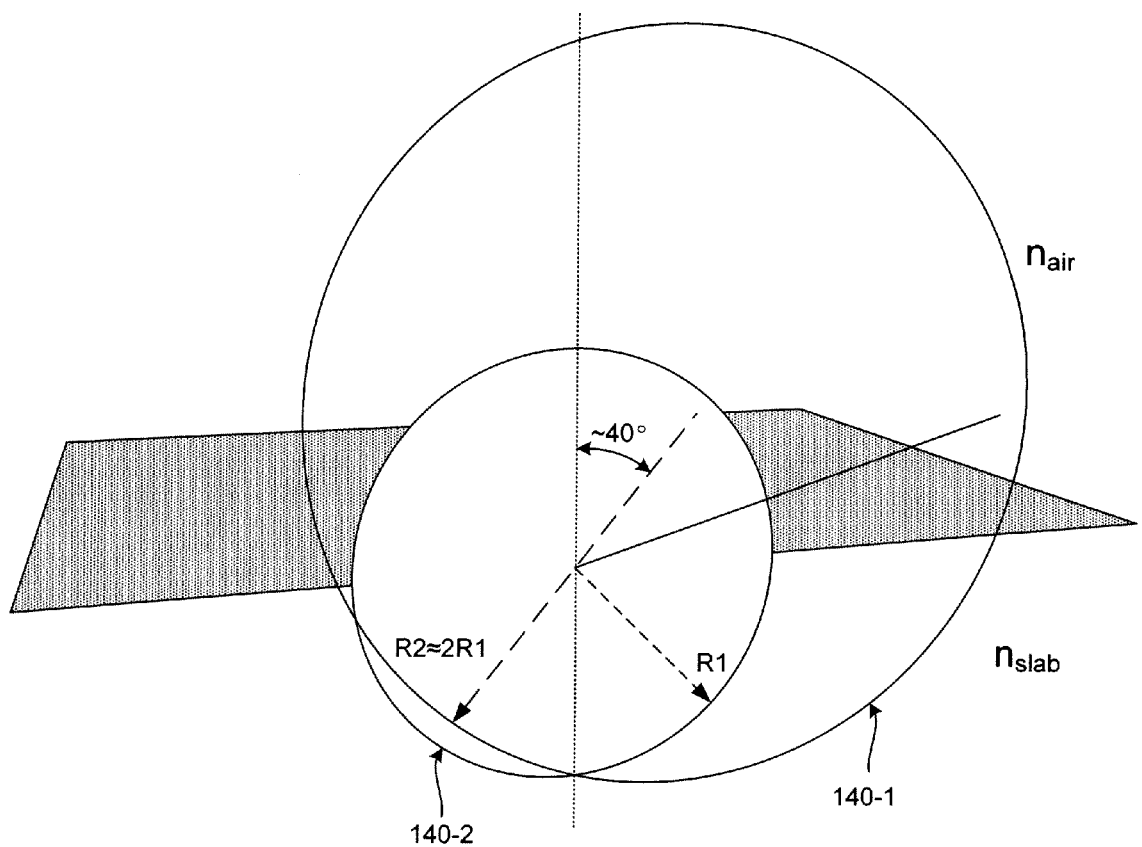
FIG. 5 is a diagram showing relative sizes of a collimating reflector surface portion and a returner surface portion of the solar concentrator of FIG. 3.

Referring to FIG. 4(B), as indicated by the two-headed dashed-line arrow, each returner surface portion 1402A is shaped to reflect (recycle) light emissions back to outcoupling structure 130A, and each returner surface portion 1402A is positioned to receive light emissions passed by associated outcoupling structure 130A at angles that would make their redirection in the collimated direction difficult with a simple (single curve) optical element. That is, due to limitations posed by using a single optical element to redirect all of the light emissions passed through outcoupling structure 130A, not all of the light emissions can be reflected along the desired collimated direction (i.e., indicated by the dash-dot-lined arrows in FIG. 4(B)). By positioning returner surface portion 1402A to receive these "unusable" light emissions, at least some of the "unusable" light emissions can be reflected back to outcoupling structure 130A (i.e., as indicated by the two-headed dashed-line arrow in FIG. 4(B)) for recycling and eventual redirection to the target PV cell. The present inventors have determined that providing returner surface portions 1402A on each of the optical elements 140A substantially increases the amount of redirected light emissions redirected to the target PV cell, thereby significantly increasing power generation. As indicated by the diagram shown in FIG. 5, according to a specific embodiment, the collimating reflector surface portions 1401A and the returner surface portion 1402A are generated as portions of spherical surfaces, where a radius R2 of the collimating reflector surface portions 1401A is approximately two times a radius R1 of the returner surface portion 1402A. The line connecting the centers of the curvature of surface portions 1401A and 1402A will preferably make an angle with the substrate normal between 0° and 40°, while having a rotational degree of freedom around this surface normal. This angle facilitates sending collimated light to a target that appears at various angular positions from the location of the particular optical element.

Figure 6:
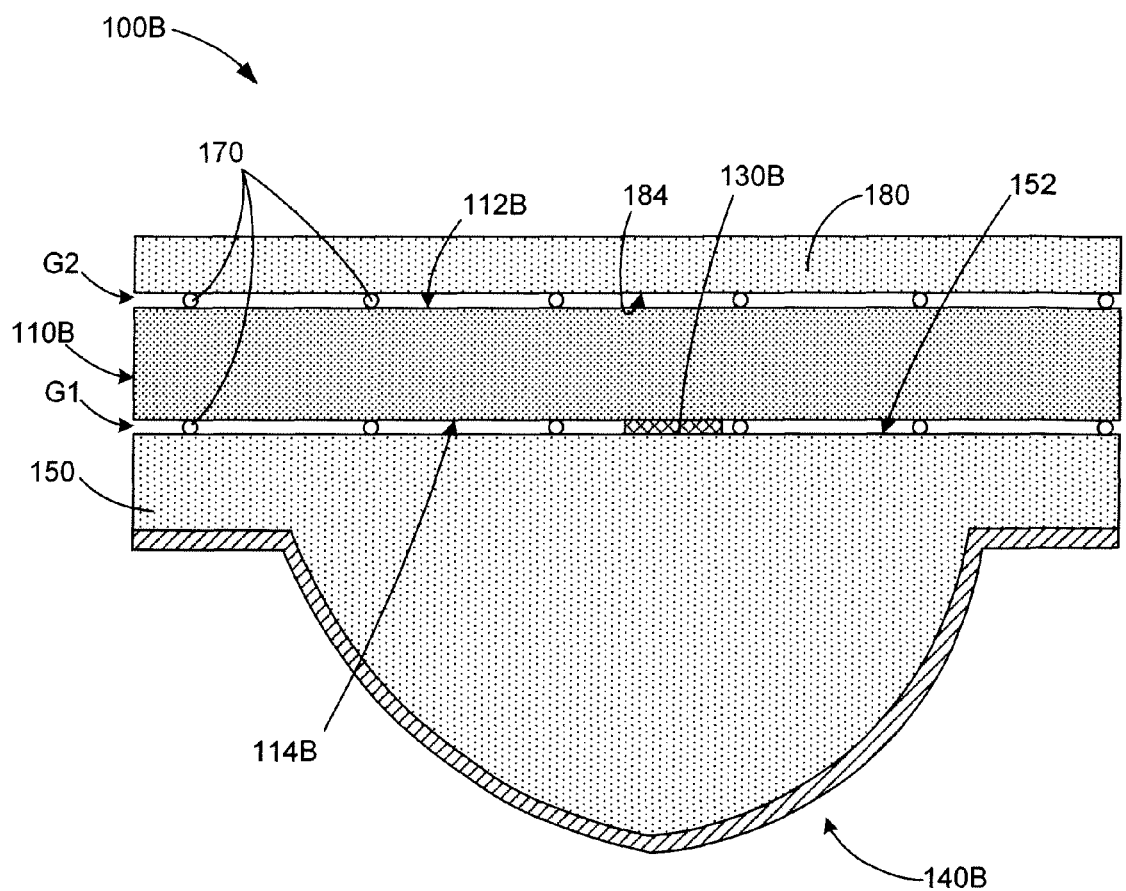
FIG. 6 is a simplified cross-sectional side view showing a solar concentrator according to a second specific embodiment of the present invention.

FIG. 6 is a simplified cross-sectional side view showing a portion of a solar concentrator 100B according to a second specific embodiment of the present invention. Solar concentrator 100B includes a light-guiding slab 110B, an outcoupling structure 130B, and an optical element 140B that are shaped and arranged essentially according to the embodiments described above, and are therefore not discussed in additional detail here for brevity. Solar concentrator 100B differs from the earlier embodiments in that it further includes a light transparent top cover 180 disposed over light-guiding slab 110B with an air gap G2 provided between a lower surface 184 of top cover 180 and upper broadside surface 112B of light-guiding slab 110B, for example, utilizing spacers 170 similar to those used to form air gap G1 between light-guiding slab 110B and optical microstructure substrate 150. A benefit of including top cover 180, which is formed using a durable light transparent material such as plastic or glass, is that it protects light-guiding slab 110B from accumulated dust and wear that might affect the total internal reflection.

Figure 7:
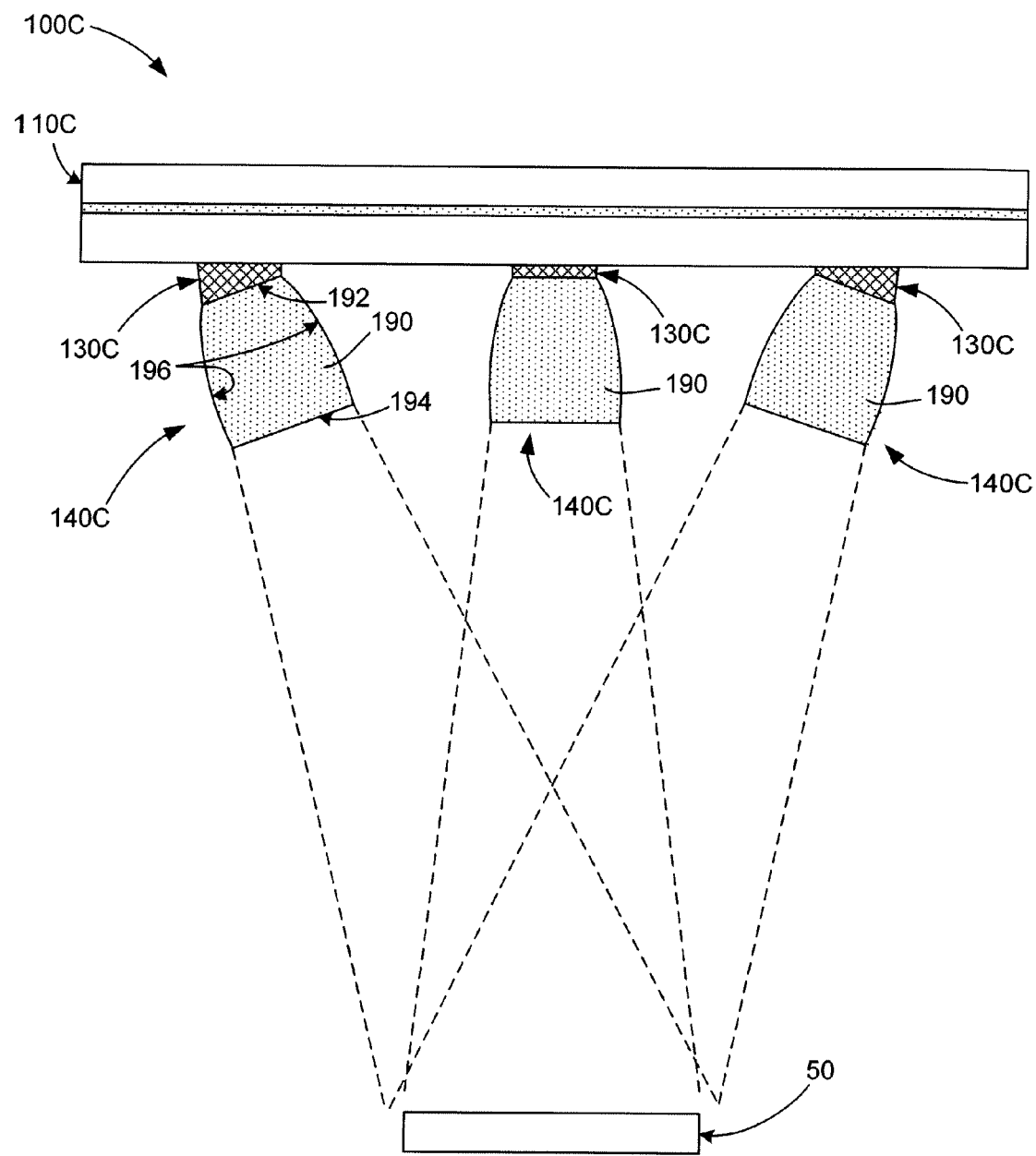
FIG. 7 is a cross-sectional side view showing a solar concentrator in accordance with a third specific embodiment of the present invention.

FIG. 7 is a simplified cross-sectional side view showing a portion of a solar concentrator 100C according to a third specific embodiment of the present invention. Solar concentrator 100C includes a light-guiding slab 110C and outcoupling structures 130C that are similar to those described above, and are therefore not discussed in additional detail here for brevity. Solar concentrator 100C differs from previous embodiments in that optical elements 140C includes a compound parabolic concentrator (CPC) structure 190 that redirects the light emissions directly to target PV cell 50 (i.e., without passing through light-guiding slab 110C). Each CPC structure 190 comprises a light-transparent material (e.g., glass or plastic) of a predetermined refractive index, and includes an entry surface 192 coupled by way of an associated outcoupling structure 130C to light-guiding slab 110C, an exit surface 194 disposed at an end opposite to entry surface 192, and one or more parabolic surfaces 196 that extend from entry surface 192 to exit surface 194. Suitable CPC structures are described in further detail, for example, in U.S. Pat. No. 7,706,030, which is incorporated herein by reference in its entirety. By utilizing CPC structures 190, light emissions escaping light-guiding slab 110C through a corresponding outcoupling structure 130C are directed by TIR from parabolic surfaces 196 along a predetermined light path toward target PV cell 50, thereby avoiding possible losses incurred when light emissions are directed through the light-guiding slab, as used in some of the embodiments described above. According to an aspect, each CPC structures 190 is arranged such that light transmitted from different regions of solar concentrator 100C converge on target PV cell 50, as indicated in FIG. 7. Note that the direction of light emission (target) may be on a different side of the slab-like system, which is a desirable feature for certain application scenarios.

FIGS. 8 to 11 are simplified figures illustrating various stationary solar energy harvesting system modules that are formed in according with exemplary specific embodiments of the present invention. Each system module includes one or more solar receptors and one or more solar concentrators, where each of the solar concentrators are formed according to any of the embodiments described above unless otherwise specified. Those skilled in the art will recognize that the system modules described with reference to FIGS. 8-11 may be utilized to form a solar energy harvesting system that generates a relatively small amount of power, or may be combined with other system modules using known techniques to provide a relatively high-power-output solar energy harvesting system.

Figure 8:
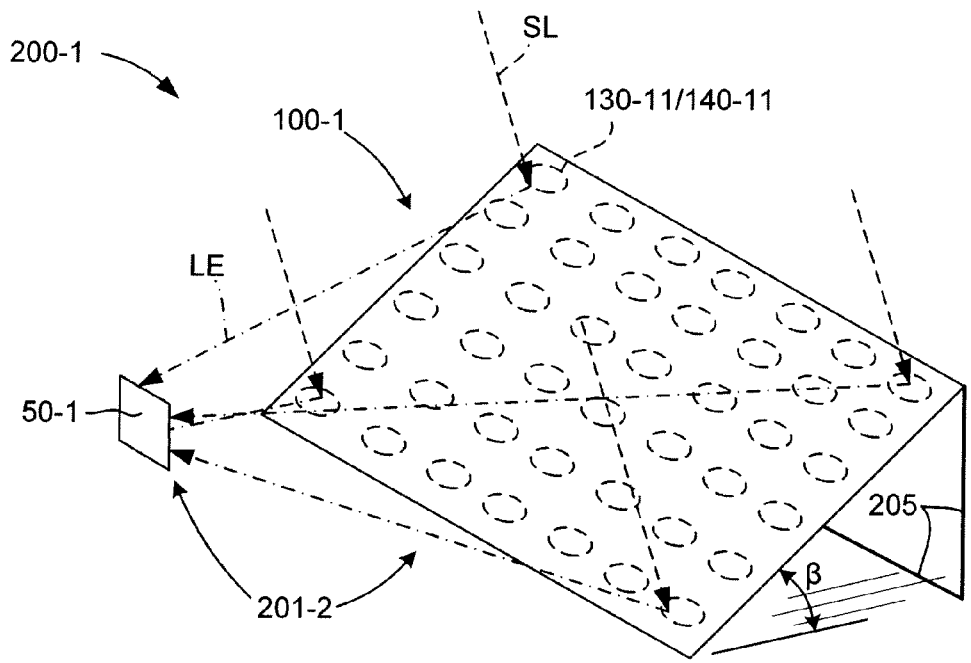
FIG. 8 is a simplified perspective view showing a PV farm utilizing any of the solar concentrators described above in accordance with another embodiment of the present invention.

FIG. 8 shows a first exemplary module 201-1 of a stationary solar energy harvesting system 200-1 that may be used as part of an untracked photovoltaic (PV) farm arranged in a manner similar to well-known "fixed-tilt" PV farms. System module 201-1 generally includes PV cell 50-1 and one or more corresponding solar concentrator 100-1, wherein solar concentrator 100-1 is disposed as a panel that is fixedly held at a predetermined angle $\beta$ relative to ground G, e.g., by a frame 205, in order to effectively capture sunlight beams SL. As described above and indicated in simplified form in FIG. 8, solar concentrator 100-1 includes a luminescent material layer (not shown) for converting sunlight SL into light emissions LE, and pairs of outcoupling structures 130-11 and optical elements 140-11 that redirect light emissions LE in predetermined directions such that light emissions LE are substantially homogenously applied on PV cell 50. In one embodiment, solar cell 50-1 is mounted on the unused ("shady") side of an adjacent solar concentrator (not shown) in order to maximize the amount of usable sunlight, and positioned to receive the concentrated light emissions LE transmitted from the solar concentrator 10× in the manner described above.

Figure 9:
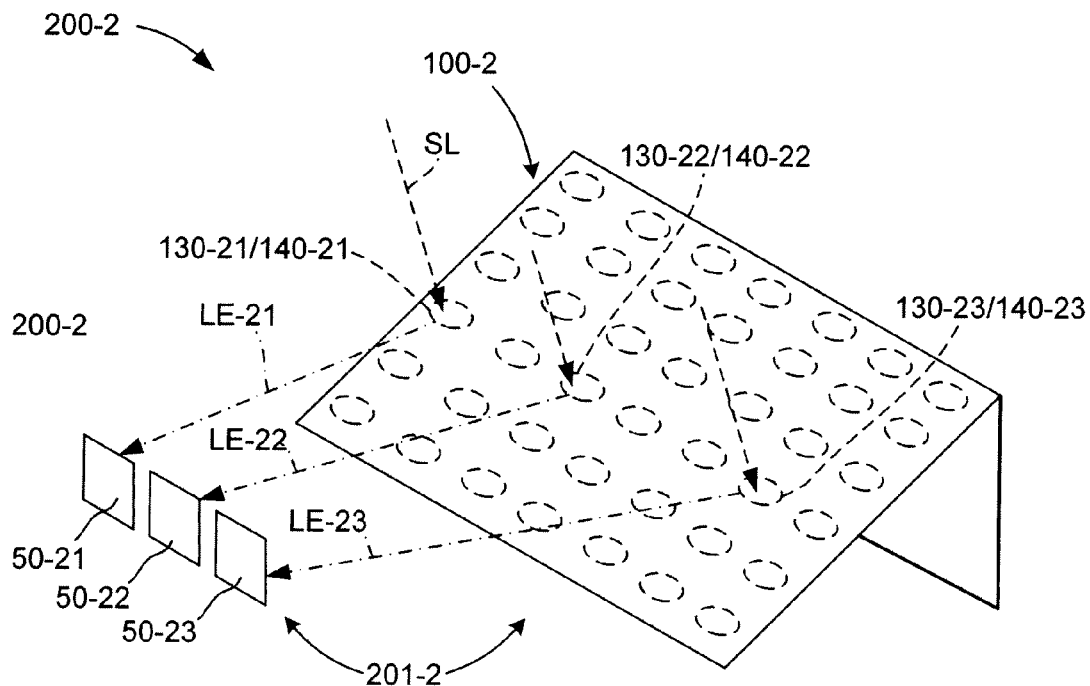
FIG. 9 is a simplified perspective view showing another PV farm utilizing the solar concentrators described above in accordance with another embodiment of the present invention.

FIG. 9 shows a module 201-2 for a stationary solar energy harvesting system 200-2 in accordance with a second exemplary embodiment. System module 201-2 includes three solar cells 50-21, 50-22 and 50-23, where each solar cells 50-21, 50-22 and 50-23 is constructed using known techniques to convert light emissions having a unique (i.e., different from the other solar cells) wavelength range. For example, solar cell 50-21 is constructed to process light emissions LE-21 having relatively short wavelengths, solar cell 50-22 is constructed (i.e., bandgap matched) to process light emissions LE-21 having "medium" wavelengths that are longer than the shorter wavelengths of solar cell 50-21, and solar cell 50-23 is constructed to process light emissions LE-21 having wavelengths that are longer than both of solar cells 50-21 and 50-22. In addition, solar concentrator 100-2 is constructed to include multiple luminescent material layers (e.g., as described below with reference to FIG. 10) that have unique operating spectrums that generate light emissions LE-21, LE-22 and LE-23 having different (i.e., short, medium and long) wavelength ranges that are bandgap-matched to those of solar cells 50-21, 50-22 and 50-23. Solar concentrator 100-2 is also arranged such that the outcoupling structures 130-21, 130-22 and 130-23 and associated optical elements 140-21, 140-22 and 140-23 are positioned to direct light emissions of each of the different spectrums to an associated bandgap-matched solar cell. For example, outcoupling structure 130-21 and associated optical element 140-21 are arranged to direct light emissions LE-21 to solar cell 50-21, which is bandgap-matched to process light emissions LE-21. Similarly, outcoupling structure 130-22 and associated optical element 140-22 are arranged to direct light emissions LE-22 to solar cell 50-22, and outcoupling structure 130-23 and associated optical element 140-23 are arranged to direct light emissions LE-23 to solar cell 50-23. This arrangement provides a more efficient conversion of sunlight energy to usable light emissions, and facilitates the production of PV cells that exhibit more efficient conversion of light emissions to electrical energy due to their narrower operating spectrum.

Figure 10:
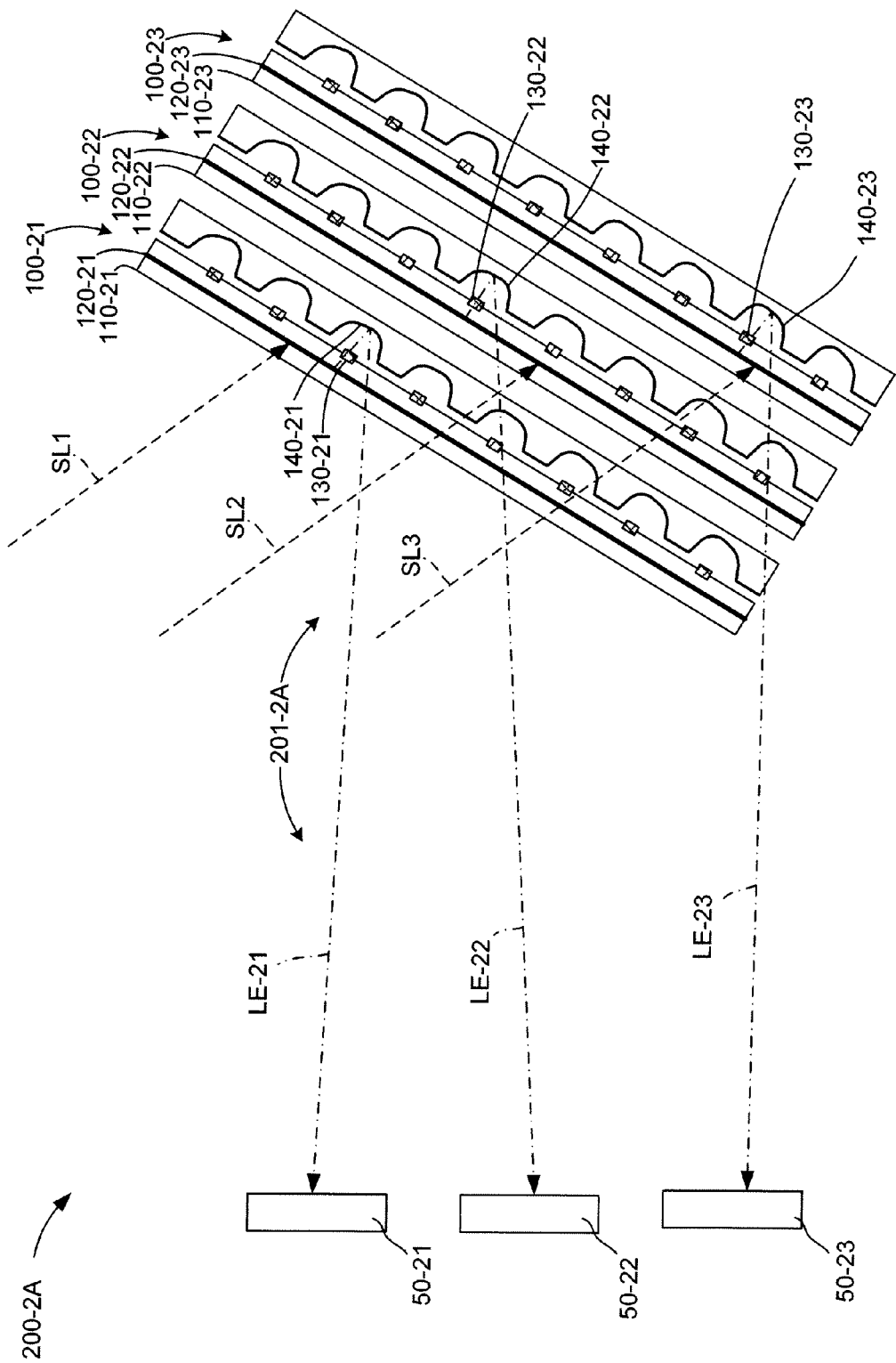
FIG. 10 is a simplified cross-sectional side views showing the PV farm of FIG. 8 during operation.

FIG. 10 shows a module 201-2A for a stationary solar energy harvesting system 200-2A, which represents one specific embodiment capable of implementing the multiple solar cell arrangement described above with reference to FIG. 9. System module 201-2A utilizes three solar concentrators 100-21, 100-22 and 100-23 that are positioned in a stacked arrangement, where each solar concentrators 100-21, 100-22 an 100-23 includes an associated luminescent material layer 120-21, 120-22 and 120-23, respectively, and associated outcoupling structure/optical element pairs 130-21/140-21, 130-22/140-22 and 130-23/140-23, respectively. Each luminescent material layer 120-21, 120-22 and 120-23 includes a unique luminescent material having a different operating spectrum such that sunlight SL1 having a first wavelength is processed by the luminescent material of layer 120-21 to generate light emissions LE-21, such that sunlight SL2 having a second wavelength passes through layer 120-21 and is processed by the luminescent material of layer 120-22 to generate light emissions LE-22, and such that sunlight SL3 having a third wavelength passes through layers 120-21 and 120-22 and is processed by the luminescent material of layer 120-23 to generate light emissions LE-23. In addition, the associated outcoupling structure/optical element pairs of each solar concentrator 100-21, 100-22 and 100-23 is arranged to direct the light emissions generated by its luminescent material layer to an associated bandgap-matched solar cell 50-21, 50-22 or 50-23. For example, the pair formed by outcoupling structure 130-21 and optical element 140-21 of solar concentrator 100-21 are arranged to direct light emissions LE-21 to solar cell 50-21. Similarly, outcoupling structure 130-22 and optical element 140-22 of solar concentrator 100-22 are arranged to direct light emissions LE-22 to solar cell 50-22, and outcoupling structure 130-23 and optical element 140-23 of solar concentrator 100-23 are arranged to direct light emissions LE-23 to solar cell 50-23. This arrangement (with "spectral splitting") is believed to provide efficient processing of sunlight based on the well published studies giving a higher efficiency ceiling for multi-junction cells than for single junction cells.

Figure 11:
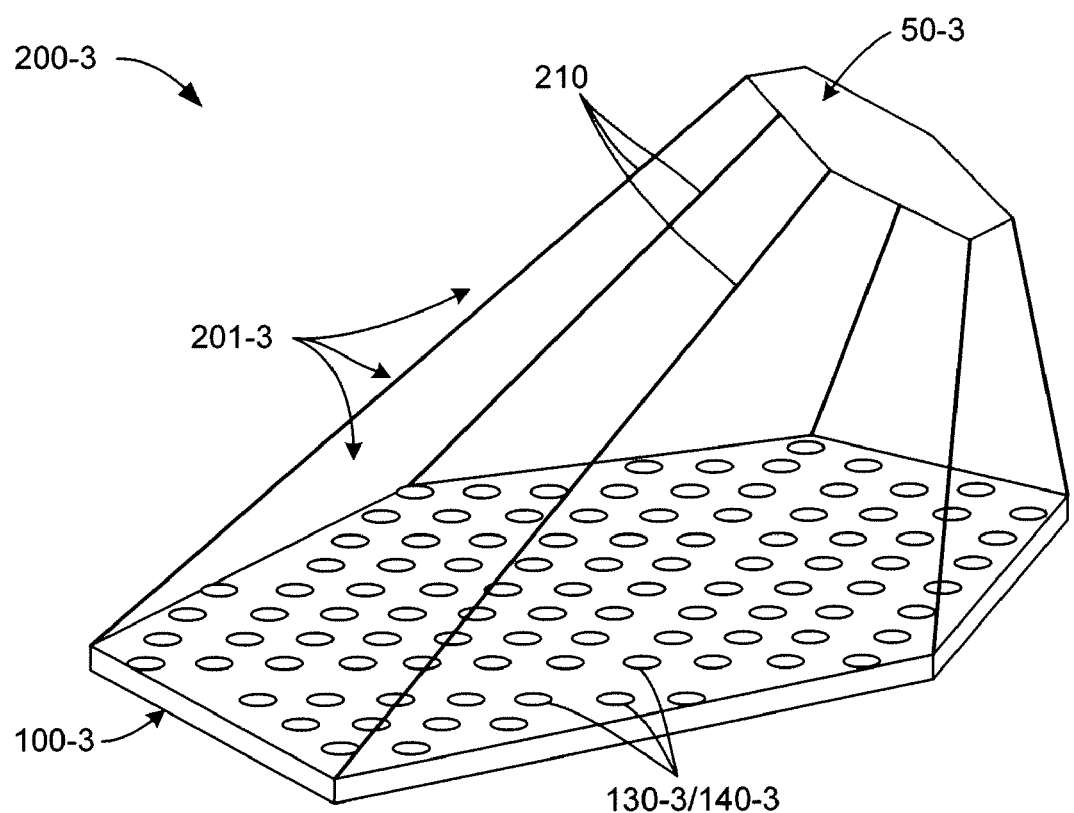
FIG. 11 is a partial perspective view showing a PV farm utilizing the solar concentrators described above in accordance with another embodiment of the present invention.

FIG. 11 shows a module 201-3 of a stationary solar energy harvesting system 200-3 according to another alternative embodiment of the present invention. System module 201-3 includes a solar concentrator 100-3, which is produced according to any of the embodiments described above, that is disposed flat on the ground or other support surface, and an associated solar cell 50-3 that is held by support aims 210 that extend between solar concentrator 100-3 and solar cell 50-3. Similar to previous embodiments, solar concentrator 100-3 includes multiple associated outcoupling structure/optical element pairs 130-3/140-3 that are oriented to direct light emissions upward onto the downward facing active surface of solar cell 50-3. An advantage of this arrangement is that it may minimize wind-related issues and may improve efficiency and the longevity of solar cell 50-3 because solar cell 50-3 points downward and is thus less likely to be damaged by dust.

Figure 12:
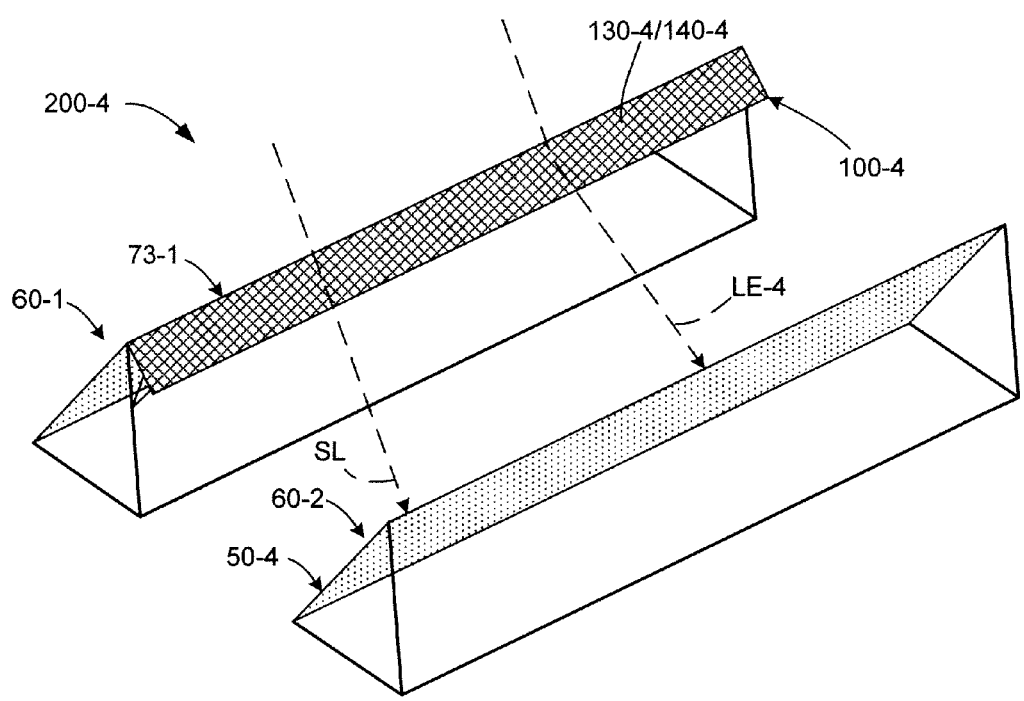
FIG. 12 is a top rear perspective view showing a portion of a fixed-tilt PV farm utilizing the solar concentrators described above in accordance with another embodiment of the present invention.
Figure 13:
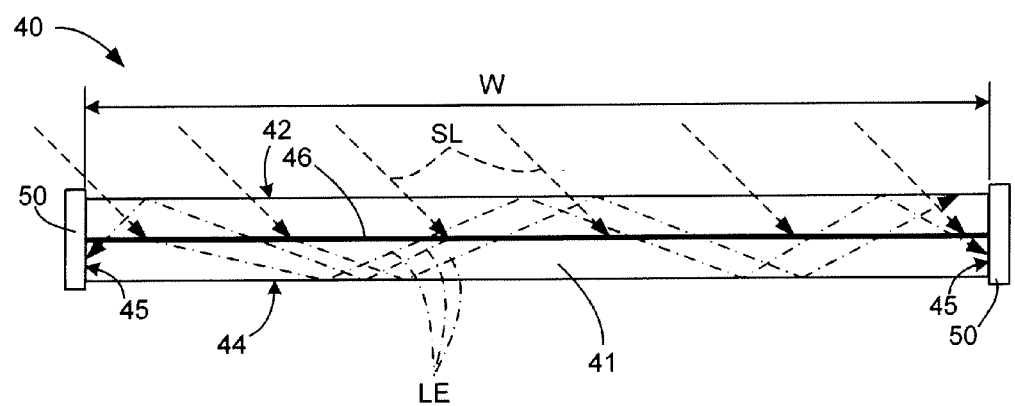
FIG. 13 is a cross-sectional side views showing a prior art luminescent concentrator.

FIG. 12 is a top rear perspective view showing a portion of fixed-tilt PV farm (stationary solar energy harvesting system) 200-4 including conventional PV panel assemblies 60-1 and 60-2, where PV farm 200-4 is modified to include a solar concentrator 100-4 having outcoupling structures/optical elements 130-4/140-4 formed in accordance with the embodiments described above in order to increase efficiency. That is, each conventional PV panel assembly 60-1 and 60-2 includes multiple solar receptors 50-4 disposed in an array pattern and arranged to convert direct sunlight SL into electricity according to known techniques. Solar concentrator 100-4 is fixedly connected to the backside upper edge 73-1 of PV panel assembly 60-1 and extends at a downward angle into an area between PV panel assemblies 60-1 and 60-2, and is arranged to direct light emissions LE-4 onto solar receptors 50-4 of PV panel assembly 60-2. By locating solar concentrator 100-4 in an offset space separating adjacent PV panel assemblies 60-1 and 60-2, and by arranging solar concentrator 100-4 to direct light emissions in a substantially homogenous pattern (i.e., such that all of the solar cells 50-4 receive substantially the same amount of redirected sunlight), the present embodiment increases electricity generation by PV panel assembly 60-2 utilizing sunlight that would otherwise be "wasted" by falling into the offset area separating PV panel assemblies 60-1 and 60-2. The present embodiment is most effectively utilized at latitudes in the range of 23 and 67 degrees (north or south), where relatively large required offset spacing between adjacent fixed-tilt panel assemblies provides significant otherwise "wasted" sunlight during the summer months.

Although the present invention has been described with respect to certain specific embodiments, it will be clear to those skilled in the art that the inventive features of the present invention are applicable to other embodiments as well, all of which are intended to fall within the scope of the present invention. For example, the stacked arrangement shown in FIG. 10 may be produced using CPC-type concentrator 100C, which is shown in FIG. 7, instead of one of the reflective-type concentrators described with reference to FIGS. 4-6.

The invention claimed is:

1. A solar concentrator for concentrating sunlight onto a solar receptor, the solar concentrator comprising:
    a light-guiding slab consisting of a light transparent material and having opposing parallel first and second broadside surfaces, and a luminescent material disposed in the light-guiding slab, the luminescent material being capable of absorbing sunlight having a first wavelength within a first wavelength range and generating light emissions having a second wavelength within a second wavelength range, the second wavelength of said light emissions being longer than the first wavelength, wherein said first and second broadside surfaces are formed and the light transparent material is selected such that, when sunlight enters the light-guiding slab and causes the luminescent material to produce said light emissions, at least some of the energy emissions are retained within the light-guiding slab by total internal reflection off of portions of the first and second broadside surfaces;
    a plurality of spaced-apart outcoupling structures, each said outcoupling structure being disposed on a corresponding outcoupling region of one of said first and second broadside surfaces, each outcoupling structure including a low-absorption, light scattering material disposed on said corresponding outcoupling region such that, when said retained light emissions are reflected onto said said corresponding outcoupling region, said retained light emission is redirected by said each outcoupling structure out of said light-guiding slab; and
    a plurality of optical elements fixedly secured to the light-guiding slab, each of the optical elements being arranged relative to an associated one of said plurality of outcoupling structures such that at least some of said light emissions passed out of said light-guiding slab by each said one of said plurality of outcoupling structures is directed into said associated optical element, wherein each of the optical elements is formed such that said light emissions are then redirected by said associated optical element in a predetermined direction toward said solar receptor.

2. The solar concentrator of claim 1, wherein the luminescent material disposed in the light-guiding slab is characterized in that the first wavelength range and the second wavelength range define a common overlap range that is less than 10% of an overall absorption/emission wavelength range defined by the first and second wavelength ranges.

3. The solar concentrator of claim 1,
    wherein the plurality of outcoupling structures are disposed in a matrix pattern on said second surfaces such that adjacent pairs of outcoupling structures are separated by a nominal spacing in the range of 0.05 mm and 5 mm, and
    wherein each of the plurality of outcoupling structures is formed such that each corresponding outcoupling region has an area in the range of $0.001S^2$ and $0.3S^2$.

4. The solar concentrator of claim 1, wherein the plurality of optical elements are arranged such that the light emissions redirected by the plurality of optical elements are substantially concentrated at a predetermined position away from said solar concentrator.

5. The solar concentrator of claim 1, wherein each of the plurality of outcoupling structures is disposed on the first broadside surface, and wherein the solar concentrator comprises a plurality of reflective light caps, each reflective light cap being disposed over a corresponding outcoupling structure of the plurality of outcoupling structures.

6. The solar concentrator of claim 1, further comprising an optical microstructure substrate having a first surface and an opposing second surface,
    wherein the optical microstructure substrate is fixedly connected to the light-guiding slab such that the first surface of the optical microstructure substrate faces the second broadside surface of the light-guiding slab and an air gap is formed between the optical first surface of the optical microstructure substrate and the second broadside surface of the light-guiding slab, and
    wherein the plurality of optical elements are disposed on the second surface of the optical microstructure substrate.

7. The solar concentrator of claim 6,
    wherein the optical microstructure substrate further comprises a plurality of dome-shaped protuberances extending from the second surface,
    wherein the solar concentrator further comprises a reflective material layer disposed over the plurality of dome-shaped protuberances, and
    wherein each of the plurality of optical elements comprises a mirror formed by a corresponding portion of the reflective material layer disposed on a corresponding one of said plurality of dome-shaped protuberances.

8. The solar concentrator of claim 7, wherein each of the plurality of optical elements comprises a collimating surface portion shaped such that light emissions passed by said associated outcoupling structure onto any point of the collimating surface portion are redirected in a substantially parallel direction.

9. The solar concentrator of claim 8, wherein the plurality of optical elements are shaped and arranged such that the light emissions collectively redirected by the collimating reflector surfaces of the plurality of optical elements are substantially concentrated at a predetermined target region.

10. The solar concentrator of claim 8, wherein each of the plurality of optical elements further includes a returner surface portion shaped such that light emissions passed by said associated outcoupling structure onto any point of the returner surface portion are redirected back to the associated outcoupling structure.

11. The solar concentrator of claim 10, wherein each of the plurality of optical elements comprises a portion of a corresponding spherical surface, wherein a first radius of curvature of each said returner surface portion is approximately one-half of a second radius of curvature of each said collimating reflector surface portion.

12. The solar concentrator of claim 1, further comprising a light transparent top cover disposed on the light-guiding slab such that a lower surface of the top cover faces the first broadside surface of the light-guiding slab and an air gap is formed between the lower surface of the top cover and the first broadside surface of the light-guiding slab.

13. The solar concentrator of claim 1, wherein each of the plurality of optical elements comprises a compound parabolic shape including an entry surface disposed at a first end and coupled by way of said associated outcoupling structure to the light-guiding slab, an exit surface disposed at a second end opposite to the entry surface, and one or more parabolic surfaces that extend from the entry surface to the exit surface.

14. A solar concentrator for concentrating sunlight onto a solar receptor, the solar concentrator comprising:
- a light-guiding slab consisting of a light transparent material and having opposing parallel first and second broadside surfaces, and a luminescent material disposed in the light-guiding slab, the luminescent material being capable of absorbing sunlight having a first wavelength within a first wavelength range and generating light emissions having a second wavelength within a second wavelength range, the second wavelength of said light emissions being longer than the first wavelength, wherein said first and second broadside surfaces are formed and the light transparent material is selected such that, when sunlight enters the light-guiding slab and causes the luminescent material to produce said light emissions, at least some of the energy emissions are retained within the light-guiding slab by total internal reflection off of portions of the first and second broadside surfaces;
- means for causing said light emissions retained within the light-guiding slab by total internal reflection and directed onto spaced-apart outcoupling regions of at least one of said first and second broadside surfaces to be passed out of said light-guiding slab; and
- a plurality of optical elements fixedly secured to the light-guiding slab, each of the optical elements being arranged relative to an associated one of said plurality of outcoupling regions such that at least some of said light emissions passed out of said light-guiding slab is directed into said plurality of optical elements, wherein the plurality of optical elements are formed such that said light emissions are then redirected by said plurality of optical elements in predetermined directions toward said solar receptor.

15. The solar concentrator of claim 14,
wherein the plurality of outcoupling regions are disposed in a matrix pattern on one of said first and second broadside surfaces such that adjacent pairs of outcoupling regions are separated by a nominal spacing in the range of 0.05mm and 5mm, and
wherein each of the plurality of outcoupling regions has an area in the range of $0.001S^2$ and $0.3S^2$.

16. The solar concentrator of claim 14, wherein the plurality of optical elements are arranged such that the light emissions passed out of the light guiding slab are substantially concentrated at a predetermined position away from said solar concentrator.

17. The solar concentrator of claim 14, wherein each of the plurality of outcoupling regions is disposed on the first broadside surface, and wherein the solar concentrator comprises a plurality of reflective light caps, each reflective light cap being disposed over a corresponding outcoupling region.

18. The solar concentrator of claim 14, further comprising an optical microstructure substrate having a first surface and an opposing second surface,
wherein the optical microstructure substrate is fixedly connected to the light-guiding slab such that the first surface of the optical microstructure substrate faces the second broadside surface of the light-guiding slab and an air gap is formed between the optical first surface of the optical microstructure substrate and the second broadside surface of the light-guiding slab,
wherein each of the plurality of outcoupling regions is disposed on the second broadside surface, and
wherein the plurality of optical elements are disposed on the second surface of the optical microstructure substrate.

19. The solar concentrator of claim 18,
wherein the optical microstructure substrate further comprises a plurality of dome-shaped protuberances extending from the second surface,
wherein the solar concentrator further comprises a reflective material layer disposed over the plurality of dome-shaped protuberances, and
wherein each of the plurality of optical elements comprises a mirror formed by a corresponding portion of the reflective material layer disposed on a corresponding one of said plurality of dome-shaped protuberances.

20. The solar concentrator of claim 19, wherein each of the plurality of optical elements comprises a collimating surface portion shaped such that light emissions passed by said associated outcoupling structure onto any point of the collimating surface portion are redirected in a substantially parallel direction.

* * * * *